(12) United States Patent
Ok et al.

(10) Patent No.: US 9,728,686 B2
(45) Date of Patent: Aug. 8, 2017

(54) METHOD OF FABRICATING WHITE LED DEVICES

(71) Applicant: SAMSUNG ELECTRONICS CO., LTD., Suwon-si (KR)

(72) Inventors: Jung-Tae Ok, Seongnam-si (KR); Min-Jung Kim, Suwon-si (KR); Jeong-Hee Kim, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/572,662

(22) Filed: Dec. 16, 2014

(65) Prior Publication Data

US 2015/0179901 A1 Jun. 25, 2015

(30) Foreign Application Priority Data

Dec. 23, 2013 (KR) ........................ 10-2013-0161656

(51) Int. Cl.
*H01L 33/50* (2010.01)
*H01L 33/60* (2010.01)
(Continued)

(52) U.S. Cl.
CPC ............ *H01L 33/504* (2013.01); *H01L 24/97* (2013.01); *H01L 33/505* (2013.01); *H01L 33/60* (2013.01); *H01L 25/0753* (2013.01); *H01L 33/46* (2013.01); *H01L 33/62* (2013.01); *H01L 2224/73253* (2013.01); *H01L 2924/0002* (2013.01);
(Continued)

(58) Field of Classification Search
CPC ..... H01L 33/505; H01L 33/50; H01L 33/504; H01L 33/507; H01L 33/60
See application file for complete search history.

(56) References Cited

U.S. PATENT DOCUMENTS

| 8,680,558 | B1 * | 3/2014 | Tischler | ................ H01L 33/50 |
| | | | | 257/80 |
| 8,710,740 | B2 | 4/2014 | Nakamura et al. | |

(Continued)

FOREIGN PATENT DOCUMENTS

| JP | 2013-021314 A | 1/2013 |
| KR | 10-1118533 B1 | 3/2012 |

(Continued)

*Primary Examiner* — Bilkis Jahan
*Assistant Examiner* — Victor Barzykin
(74) *Attorney, Agent, or Firm* — Muir Patent Law, PLLC

(57) ABSTRACT

A light emitting device and a method of fabricating the same is provided. The device includes an LED chip having a first main surface, a second main surface opposing the first main surface, and one or more side surfaces extending between the first and second main surfaces. A reflective side layer surrounds the one or more side surfaces of the LED chip. The reflective side layer has a first main surface and a second main surface opposing the first main surface extending in a first direction, and an opening extending between the first and second main surfaces in a second direction substantially perpendicular to the first direction. The opening surrounds the chip. A phosphor film overlies the first main surface of the chip and the first main surface of the reflective side layer. At least one electrode is disposed on the second main surface of the chip.

17 Claims, 44 Drawing Sheets

(51) Int. Cl.
*H01L 23/00* (2006.01)
*H01L 25/075* (2006.01)
*H01L 33/46* (2010.01)
*H01L 33/62* (2010.01)

(52) U.S. Cl.
CPC ............... *H01L 2933/0041* (2013.01); *H01L 2933/0058* (2013.01)

(56) References Cited

U.S. PATENT DOCUMENTS

| | | | | |
|---|---|---|---|---|
| 2010/0127286 | A1* | 5/2010 | Schmidt | C09K 11/0883 257/98 |
| 2011/0309398 | A1* | 12/2011 | Ito | H01L 33/505 257/98 |
| 2012/0037886 | A1* | 2/2012 | Hsu | G02B 6/0031 257/13 |
| 2012/0112229 | A1* | 5/2012 | Park | H01L 33/486 257/98 |
| 2012/0182714 | A1* | 7/2012 | Kwon | G02B 5/02 362/84 |
| 2012/0241797 | A1 | 9/2012 | Kim et al. | |
| 2012/0305970 | A1 | 12/2012 | Kim | |
| 2013/0187174 | A1* | 7/2013 | Tischler | H01L 33/50 257/80 |
| 2013/0187178 | A1* | 7/2013 | Tischler | H01L 33/50 257/88 |

FOREIGN PATENT DOCUMENTS

| KR | 10-2012-0119396 A | 10/2012 |
|---|---|---|
| KR | 10-2013-0060638 A | 6/2013 |

\* cited by examiner

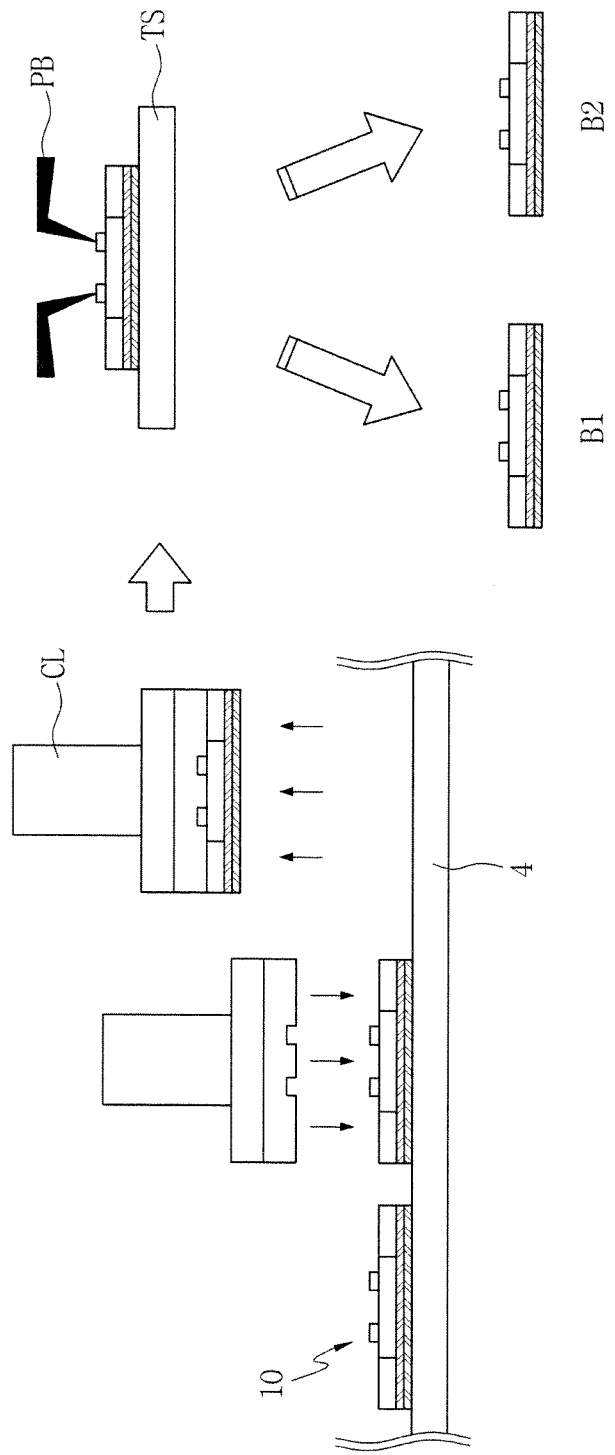

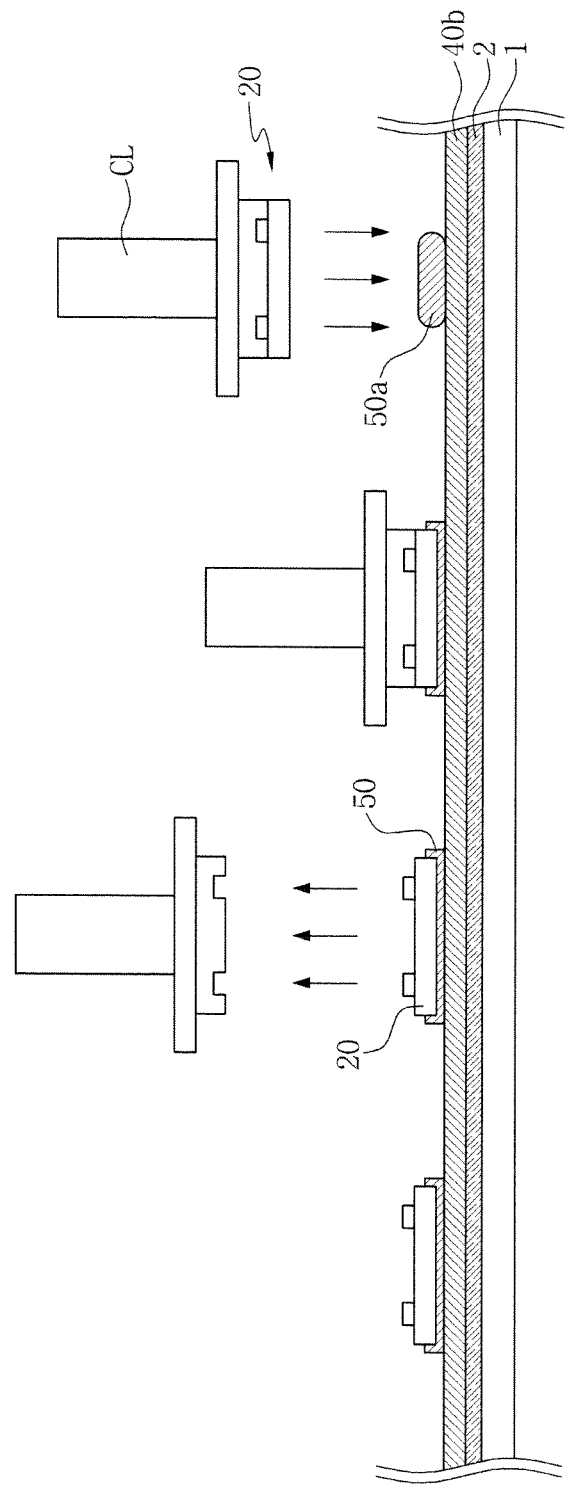

METHOD OF FABRICATING WHITE LED DEVICES

CROSS-REFERENCE TO RELATED APPLICATION

This application claims priority under 35 U.S.C. §119 to Korean Patent Application No. 10-2013-0161656 filed on Dec. 23, 2013, the disclosure of which is hereby incorporated by reference in its entirety.

TECHNICAL FIELD

Embodiments of the disclosure relate to white LED devices, and a method of fabricating the same.

BACKGROUND

White LED devices are used in various illumination apparatuses due to a long life span and low power consumption. In particular, demands of white LED devices which generate white light are growing.

SUMMARY

Embodiments of the present disclosure include various white LED devices having higher light emitting efficiency and longer life span, and methods of fabricating the same.

An embodiment of the disclosure provides a light emitting device. The light emitting device includes an LED chip having a first main surface, a second main surface opposing the first main surface, and one or more side surfaces extending between the first main surface and second main surface. A reflective side layer surrounds the one or more side surfaces of the LED chip. The reflective side layer has a first main surface and a second main surface opposing the first main surface extending in a first direction, and an opening extending between the first main surface and the second main surface in a second direction substantially perpendicular to the first direction. The opening surrounds the LED chip. A phosphor film overlies the first main surface of the LED chip and the first main surface of the reflective side layer. At least one electrode is disposed on the second main surface of the LED chip.

In certain embodiments of the light emitting device, the reflective side layer may have one or more outer side surfaces extending between the first main surface and the second main surface of the reflective side layer in the second direction. The phosphor layer may have a first main surface and a second main surface opposing the first main surface, and one or more side surfaces extending between the first main surface and the second main surface of the phosphor film. The outer side surfaces of the reflective side layer and the side surfaces of the phosphor film may be substantially aligned along the second direction.

In certain embodiments, the light emitting device may further comprise a buffer layer between the phosphor film and the LED chip. The buffer layer may extend along the side surfaces of the LED chip.

In certain embodiments, the light emitting device may further comprise a buffer layer. Outer side surfaces of the buffer layer may be substantially aligned with the outer side surfaces of the reflective side layer and side surfaces of the phosphor film along the second direction.

In certain embodiments of the light emitting device, the phosphor film comprises a first phosphor film layer comprising a first phosphor material and a second phosphor film layer comprising a second phosphor material, wherein the second phosphor material is different from the first phosphor material.

In another embodiment of the disclosure, a light emitting device is provided comprising an LED chip having a first main surface, a second main surface opposing the first main surface, and one or more side surfaces extending between the first main surface and second main surface. A reflective side layer surrounding the one or more side surfaces of the LED chip is provided, wherein the reflective side layer has a first main surface and a second main surface opposing the first main surface. A phosphor film overlies the first main surface of the LED chip and the first main surface of the reflective side layer. At least one electrode is disposed on the second main surface of the LED chip. The first main surface of the LED chip and the first main surface of the reflective side layer are substantially coplanar.

In certain embodiment of the light emitting device the phosphor film may comprise a first phosphor film layer comprising a first phosphor material and a second phosphor film layer comprising a second phosphor material, wherein the second phosphor material is different from the first phosphor material.

In another embodiment of the disclosure, a light emitting device comprising an LED chip having a first main surface, a second main surface opposing the first main surface, and one or more side surfaces extending between the first main surface and second main surface is provided. A phosphor side layer surrounds the one or more side surfaces of the LED chip, wherein the phosphor side layer has a first main surface and a second main surface opposing the first main surface extending in a first direction. A phosphor film overlies the first main surface of the LED chip and the first main surface of the phosphor side layer, wherein the phosphor film has a first main surface and a second main surface opposing the first main surface extending in the first direction. At least one electrode is disposed on the second main surface of the LED chip. The phosphor film and the phosphor side layer are different from each other.

In certain embodiments of the light emitting device, the phosphor film and the phosphor side layer have different densities. The density of the phosphor side layer may be less than the density of the phosphor film. The density of the phosphor side layer may be about 35-50% of the density of the phosphor film.

In certain embodiments of the light emitting device, the phosphor side layer comprises a first phosphor material, and the phosphor film comprises a second phosphor material, wherein the second phosphor material is different from the first phosphor material.

In certain embodiments of the light emitting device, the phosphor side layer may have one or more outer side surfaces extending between the first main surface and the second main surface of the phosphor side layer in a second direction substantially perpendicular to the first direction, and the phosphor film has one or more side surfaces extending in the second direction between the first main surface and the second main surface of the phosphor film. The light emitting device may further comprise a buffer layer between the phosphor film and the phosphor side layer, wherein side surfaces of the buffer layer are substantially aligned with the outer side surfaces of the phosphor side layer and the side surfaces of the phosphor film along the second direction.

In certain embodiments, the light emitting device may further comprise a buffer layer between the phosphor film and the phosphor side layer. The buffer layer may extend along the side surfaces of the LED chip.

In certain embodiments of the light emitting device, the phosphor film may comprise a first phosphor film layer comprising a first phosphor material and a second phosphor film layer comprising a second phosphor material, wherein the second phosphor material is different from the first phosphor material.

In another embodiment of the disclosure, a method of fabricating a light emitting device is provide comprising forming a phosphor film and attaching a plurality of LED chips to the phosphor film. Each LED chip has a first main surface and a second main surface opposing the first main surface. The first main surfaces of the LED chips are attached to the phosphor film, and the LED chips are spaced-apart from each other. After attaching the LED chips, the phosphor film is cured. A reflective material is deposited between the spaced-apart LED chips to form a reflective side layer. A singulation process is performed to form a plurality of separated LED devices.

In certain embodiments of the method, the first main surface of the LED chip and a main surface of the reflective side layer may be substantially coplanar.

In certain embodiments of the method, the reflective side layer may have a first main surface and an opposing second main surface extending in a first direction, and one or more outer side surfaces extending between the reflective side layer first main surface and second main surface in a second direction substantially perpendicular to the first direction. The phosphor film may have a first main surface and an opposing second main surface extending in the first direction, and one or more side surfaces extending between the phosphor film first main surface and second main in the second direction. The outer side surfaces of the reflective side layer and the side surfaces of the phosphor film may be substantially aligned in the second direction.

In certain embodiments of the method, the curing the phosphor layer may comprise a partial cure before depositing the reflective material, and a further cure after depositing the reflective material.

In certain embodiments, the method may further comprise forming a buffer layer between the phosphor film and the LED chip. The buffer layer may extend along the side surfaces of the LED chip. The buffer layer may be applied to the phosphor film by spraying a buffer material on the phosphor film or stamping a buffer material on the phosphor film. The buffer layer may be formed after partially curing the phosphor film.

In certain embodiments, the method may further comprise forming a buffer layer between the phosphor film and the LED chip, wherein side surfaces of the buffer layer are substantially aligned with the outer side surfaces of the reflective side layer and the side surfaces of the phosphor film in the second direction.

In certain embodiments of the method, the forming the phosphor film may comprise forming a first phosphor film layer comprising a first phosphor material and a forming a second phosphor film layer comprising a second phosphor material, wherein the second phosphor material is different from the first phosphor material.

In certain embodiments of the method, the phosphor film may be cured by heating the phosphor film.

In certain embodiments, the method may further comprises forming a releasing layer prior to forming the phosphor film. The phosphor film may be applied to the releasing layer using a blade or a roller.

In another embodiment of the disclosure, a method of fabricating a light emitting device is provided comprising forming a phosphor film and attaching a plurality of LED chips to the phosphor film. Each LED chip has a first main surface and a second main surface opposing the first main surface, wherein the first main surfaces of the LED chips are attached to the phosphor film, and the LED chips are spaced-apart from each other. After attaching the LED chips, phosphor film is cured. A phosphor material is deposited between the spaced-apart LED chips to form a phosphor side layer. A singulation process is performed to form in a plurality of separated LED devices.

In certain embodiments of the method, the phosphor film and the phosphor side layer may be different from each other. The phosphor film and the phosphor side layer may have different densities, and the density of the phosphor side layer may be less than the density of the phosphor film. The density of the phosphor side layer may be about 35-50% the density of the phosphor film.

In certain embodiments of the method, the second main surface of the LED chip and a main surface of the phosphor side layer are substantially coplanar.

In certain embodiments of the method, the curing the phosphor layer comprises a partial cure before depositing the phosphor material, and a further cure after depositing the phosphor material.

In certain embodiments of the method, the phosphor side layer has a first main surface and an opposing second main surface extending in a first direction, and one or more outer side surfaces extending between the first main surface and the second main surface in a second direction substantially perpendicular to the first direction. The phosphor film may have a first main surface and an opposing second main surface extending in the first direction, and one or more side surfaces extending between the first main surface and the second main surface in the second direction. The outer side surfaces of the phosphor side layer and the side surfaces of the phosphor film may be substantially aligned in the second direction. In certain embodiments, a buffer layer may be formed between the phosphor film and the LED chip, wherein outer side surfaces of the buffer layer are substantially aligned in the second direction with the outer side surfaces of the phosphor side layer and the side surfaces of the phosphor film.

In certain embodiments, the method may further comprise forming a buffer layer between the phosphor film and the LED chip. The buffer layer may extend along the side surfaces of the LED chip. The buffer layer may be applied to the phosphor film by spraying a buffer material on the phosphor film or stamping a buffer material on the phosphor film. The buffer layer may be formed after partially curing the phosphor film.

In certain embodiments of the method, the forming the phosphor film may comprise forming a first phosphor film layer comprising a first phosphor material and a forming a second phosphor film layer comprising a second phosphor material, wherein the second phosphor material is different from the first phosphor material.

In certain embodiments of the method, the phosphor film may be cured by heating the phosphor film. The phosphor film may be applied to the releasing layer using a blade or a roller.

In certain embodiments, the method further comprises forming a releasing layer prior to forming the phosphor film.

Still other embodiments of the disclosure provide a illumination module and an illumination system having white LED devices.

The technical objectives of the disclosure are not limited to the above disclosure; other objectives may become apparent to those of ordinary skill in the art based on the following descriptions.

Details of other embodiments are included in the detailed description and drawings.

BRIEF DESCRIPTION OF THE DRAWINGS

The foregoing and other features and advantages of the disclosure will be apparent from the more particular description of preferred embodiments of the disclosure, as illustrated in the accompanying drawings in which like reference numerals denote the same respective parts throughout the different views. The drawings are not necessarily to scale, emphasis instead being placed upon illustrating the principles of the disclosure.

DETAILED DESCRIPTION

FIGS. 1A to 4E are bottom views and longitudinal-sectional views conceptually showing white LED devices in accordance with various embodiments of the disclosure.

Figure 1A:
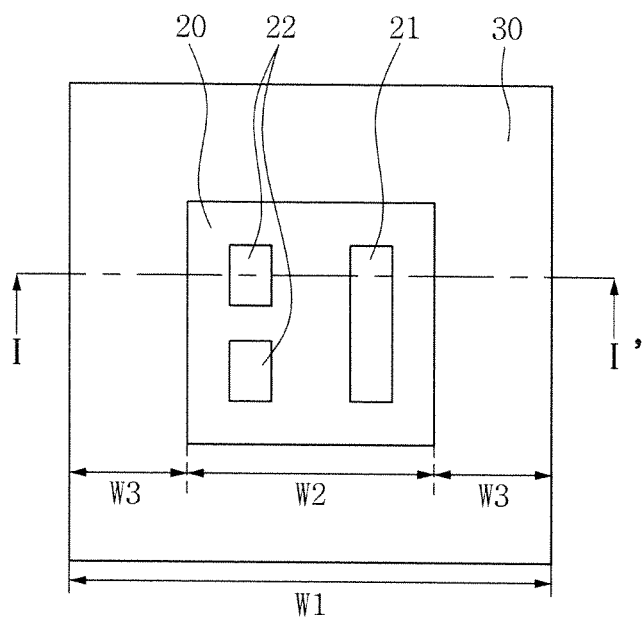
FIGS. 1A to 4E are bottom views and longitudinal-sectional views conceptually showing white LED devices in accordance with various embodiments of the disclosure.
Figure 1B:
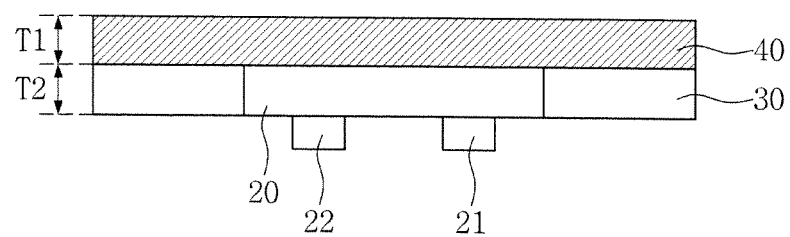

FIG. 1A is a bottom view of a white LED device in accordance with an exemplary embodiment of the disclosure, and FIG. 1B is a longitudinal-sectional view taken along line I-I' of FIG. 1A.

Referring to FIGS. 1A and 1B, a white LED device 11a in accordance with an exemplary embodiment of the disclosure may include an LED chip 20, a phosphor film 40, and a reflective side layer 30.

The LED chip 20 may generate blue light. For example, the LED chip 20 may include a blue LED. The LED chip 20 may include (+)/(−) electrodes 21 and 22 disposed on a surface thereof. The electrodes 21 and 22 may have a polygonal mesa shape protruding from a lower surface (or an upper surface) of the LED chip 20. Otherwise, the surfaces of the electrodes 21 and 22 may be planar to be coplanar with the lower surface (or the upper surface) of the LED chip 20, or buried in the LED chip 20 so that the surfaces thereof are recessed from the lower surface of the LED chip 20. When the electrodes 21 and 22 are buried, reference numerals 21 and 22 may indicate bumps. The electrodes 21 and 22 may include metals such as W, Al, Cu, Ni, Au, Ag, or another.

The phosphor film 40 may be disposed on the upper surface of the LED chip 20. A part of a lower surface of the phosphor film 40 may be in direct contact with the entire upper surface of the LED chip 20. The phosphor film 40 may be a single-layered film type or single-layered sheet type which has a substantially uniform thickness. The phosphor film 40 may include a yellow phosphor material and a base resin. For example, the phosphor material may include phosphor particles or phosphor powders, and the base resin may include silicon resin.

The reflective side layer 30 may surround side surfaces of the LED chip 20 in a top view or a bottom view. An upper surface of the reflective side layer 30 may be in direct contact with the lower surface of the phosphor film 40. The upper surface of the LED chip 20 may be planar and coplanar with the upper surface of the reflective side layer 30. The lower surface of the LED chip 20 and a lower surface of the reflective side layer 30 may be substantially planar. Side surfaces of the phosphor film 40 and side surfaces of the reflective side layer 30 may be planar and vertically aligned to form an outer side surface of the LED chip 20. The reflective side layer 30 may include a reflective material and a base resin in a ratio of about 40:60. For example, the reflective material may include a white-colored metal oxide, such as $TiO_2$, $Al_2O_3$, or $ZrO_3$. The base resin may include a transparent material such as silicon. The $TiO_2$, $Al_2O_3$, or $ZrO_3$ may exist in a particle or powder state in the reflective side layer 30 or the base resin.

When the white LED device 11a and the LED chip 20 are assumed to have a cubic shape, a horizontal width W1 of the white LED device 11a or the phosphor film 40 may be about 1.25 to 1.4 mm, a horizontal width W2 of the LED chip 20 may be about 0.7 to 0.9 mm, a horizontal width W3 of the reflective side layer 30 may be about 0.23 to 0.27 mm, a vertical thickness T1 of the phosphor film 40 may be about 0.9 to 1.1 mm, and a vertical thickness T2 of the LED chip 20 or the reflective side layer 30 may be about 0.14 to 0.18 mm. The above-mentioned values are optimized through various experiments in order for the white LED device 11a to generate optimal white light.

In the white LED device 11a in accordance with the embodiment of the disclosure, since light emitted and lost in a lateral direction of the LED chip 20 is reduced by the reflective side layer 30, an effective light emitting angle is improved to about 110°.

Figure 1C:
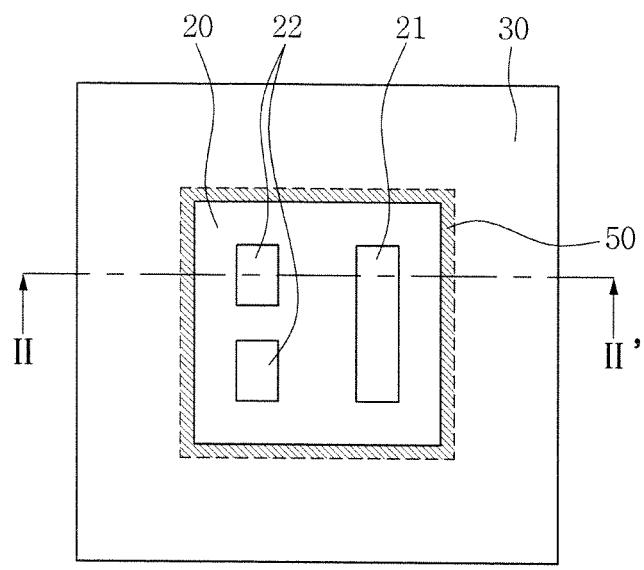
Figure 1D:
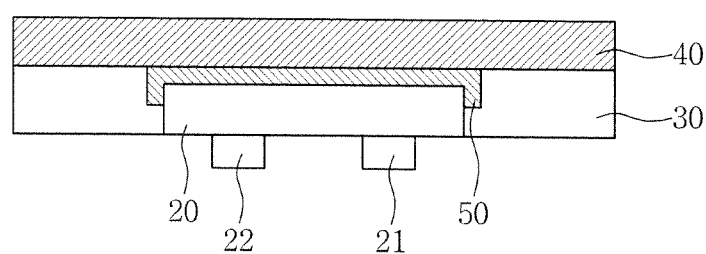

FIG. 1C is a bottom view of a white LED device in accordance with an exemplary embodiment of the disclosure, and FIG. 1D is a longitudinal-sectional view taken along II-II' of FIG. 1C.

Referring to FIGS. 1C and 1D, a white LED device 11b in accordance with an exemplary embodiment of the disclosure may include an LED chip 20, a phosphor film 40, a reflective side layer 30, and a buffer layer 50 disposed between the LED chip 20 and the phosphor film 40. The buffer layer 50 may be in direct contact with upper and side surfaces of the LED chip 20, and a part of a lower surface of the phosphor film 40. The buffer layer 50 may fully cover the upper surface of the LED chip 20, and partly cover the side surfaces of the LED chip 20. The buffer layer 50 may substantially conformably cover the upper and side surfaces of the LED chip 20. The buffer layer 50 may have a superior adhesion than the phosphor film 40. Accordingly, the LED chip 20 and the phosphor film 40 may have improved adhesion. The buffer layer 50 may include a hardened silicon resin or solidified silicone.

Figure 1E:
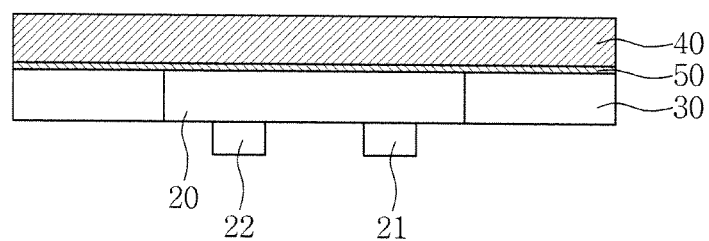

Referring to FIG. 1E, a white LED device 11c in accordance with an exemplary embodiment of the disclosure may include an LED chip 20, a phosphor film 40, a reflective side layer 30, and a buffer layer 50 disposed between the LED chip 20 and the phosphor film 40, and between the reflective side layer 30 and the phosphor film 40. The buffer layer 50 may be conformably interposed between an upper surface of the LED chip 20 and a lower surface of the phosphor film 40, and between an upper surface of the reflective side layer 30 and the lower surface of the phosphor film 40. The buffer layer 50 may be in direct contact with the upper surface of the LED chip 20, the upper surface of the reflective side layer 30, and the lower surface of the phosphor film 40. The buffer layer 50 may have a shape of a thin film such as a coated film.

Figure 1F:
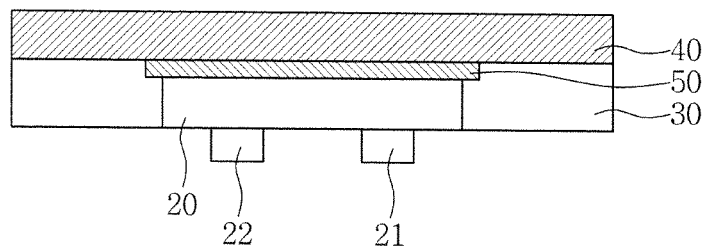

Referring to FIG. 1F, a white LED device 11*d* in accordance with an exemplary embodiment of the disclosure may include an LED chip 20, a phosphor film 40, a reflective side layer 30, and a buffer layer 50 disposed between the LED chip 20 and the phosphor film 40. The buffer layer 50 may be in direct contact with an upper surface of the LED chip 20 and a lower surface of the phosphor film 40. The buffer layer 50 may fully cover the upper surface of the LED chip 20, and substantially not cover side surfaces of the LED chip 20. In addition, the buffer layer 50 may protrude outward than the side surfaces of the LED chip 20.

Figure 1G:
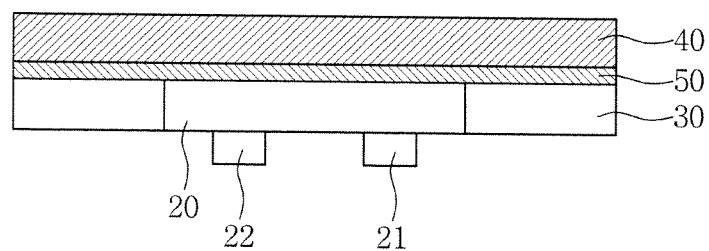

Referring to FIG. 1G, a white LED device 11*e* in accordance with an exemplary embodiment of the disclosure may include an LED chip 20, a phosphor film 40, a reflective side layer 30, and a buffer layer 50 disposed between the LED chip 20 and the phosphor film 40, and between the reflective side layer 30 and the phosphor film 40. The buffer layer 50 may be conformably interposed between an upper surface of the LED chip 20 and a lower surface of the phosphor film 40, and between an upper surface of the reflective side layer 30 and the lower surface of the phosphor film 40. The buffer layer 50 may be in direct contact with the upper surface of the LED chip 20, the upper surface of the reflective side layer 30, and the lower surface of the phosphor film 40. The buffer layer 50 may have a predetermined thickness as being formed by a spreading, plasting, or stamping method.

Figure 2A:
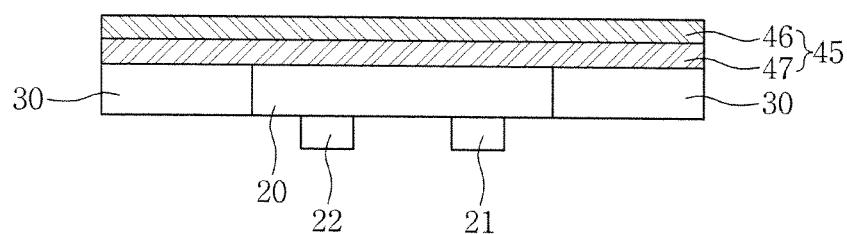

Referring to FIG. 2A, a white LED device 12*a* in accordance with an exemplary embodiment of the disclosure may include an LED chip 20, a multilayered phosphor film 45, and a reflective side layer 30. The multilayered phosphor film 45 may include an upper phosphor film 46 and a lower phosphor film 47. The upper phosphor film 46 may be stacked directly on the lower phosphor film 47. The lower phosphor film 47 may be in contact with, abut, or be adjacent to the LED chip 20 and the reflective side layer 30. The upper phosphor film 46 may include a green phosphor material and the lower phosphor film 47 may include a red phosphor material. For example, the upper phosphor film 46 may include a green phosphor film and the lower phosphor film 47 may include a red phosphor film. The upper phosphor film 46 and the lower phosphor film 47 may include yttrium aluminum garnet (YAG), silicate, or silicon.

Figure 2B:
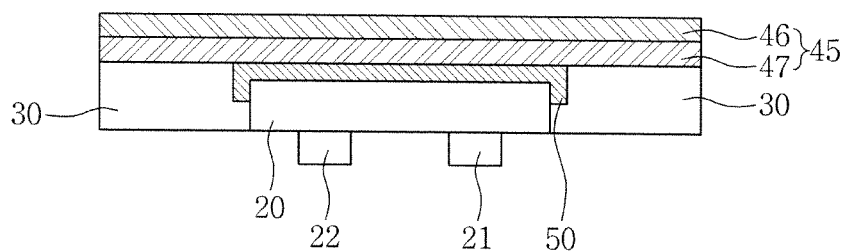

Referring to FIG. 2B, a white LED device 12*b* in accordance with an exemplary embodiment of the disclosure may include an LED chip 20, a multilayered phosphor film 45, a reflective side layer 30, and a buffer layer 50 disposed between the LED chip 20 and the multilayered phosphor film 45. The buffer layer 50 may be conformably formed on upper and side surfaces of the LED chip 20. The buffer layer 50 may be in direct contact with the upper and side surfaces of the LED chip 20, and a part of a lower surface of a lower phosphor film 47.

Figure 2C:
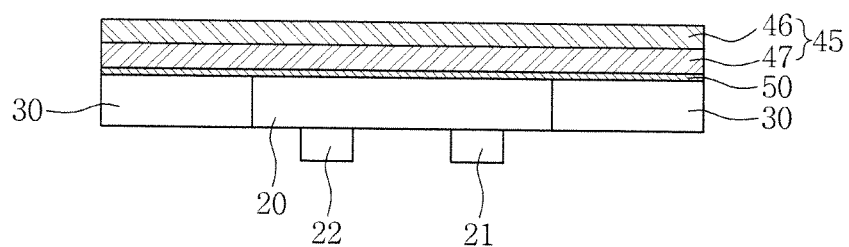

Referring to FIG. 2C, a white LED device 12*c* in accordance with an exemplary embodiment of the disclosure may include an LED chip 20, a multilayered phosphor film 45, a reflective side layer 30, and a buffer layer 50 disposed between the LED chip 20 and the multilayered phosphor film 45, and between the reflective side layer 30 and the multilayered phosphor film 45. The buffer layer 50 may be conformably interposed between an upper surface of the LED chip 20 and a lower surface of a lower phosphor film 47, and between an upper surface the reflective side layer 30 and the lower surface of the lower phosphor film 47. The buffer layer 50 may be in direct contact with the upper surface of the LED chip 20, the upper surface of the reflective side layer 30, and the lower surface of the lower phosphor film 47. The buffer layer 50 may have a thin film shape such as a coated film.

Figure 2D:
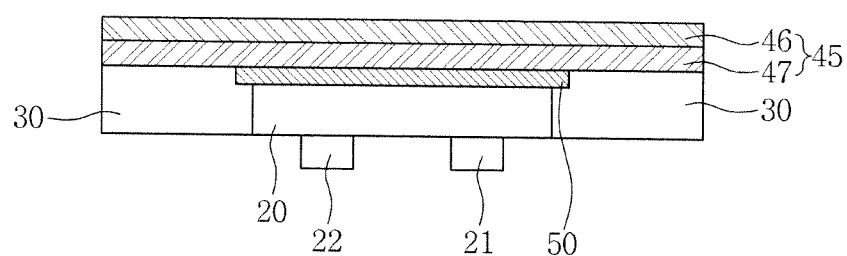

Referring to FIG. 2D, a white LED device 12*d* in accordance with an exemplary embodiment of the disclosure may include an LED chip 20, a multilayered phosphor film 45, a reflective side layer 30, and a buffer layer 50 disposed between the LED chip 20 and the multilayered phosphor film 45. The buffer layer 50 may be in direct contact with an upper surface of the LED chip 20 and a lower surface of a lower phosphor film 47.

Figure 2E:
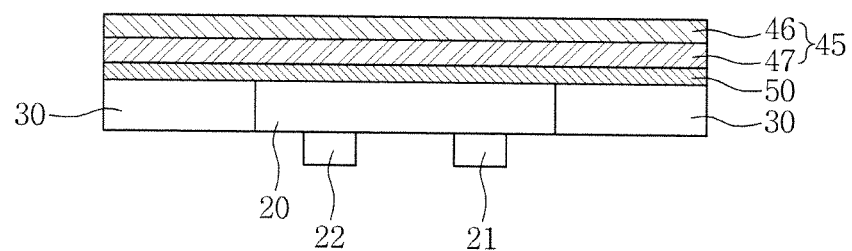

Referring to FIG. 2E, a white LED device 12*e* in accordance with an exemplary embodiment of the disclosure may include an LED chip 20, a multilayered phosphor film 45, a reflective side layer 30, and a buffer layer 50 disposed between the LED chip 20 and the multilayered phosphor film 45, and between the reflective side layer 30 and the multilayered phosphor film 45. The buffer layer 50 may have an appropriate conformal thickness.

Figure 3A:
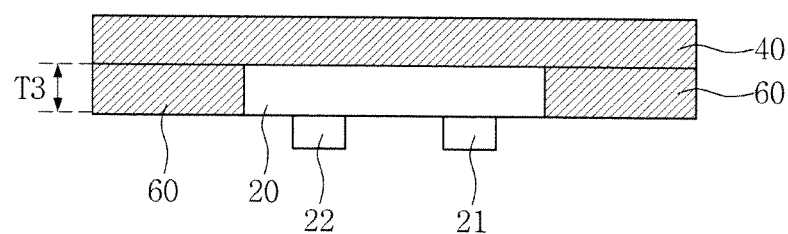

Referring to FIG. 3A, a white LED device 13*a* in accordance with an exemplary embodiment of the disclosure may include an LED chip 20, a phosphor film 40, and a phosphor side layer 60. The phosphor side layer 60 may surround side surfaces of the LED chip 20 in a top view or a bottom view. An upper surface of the phosphor side layer 60 may be in direct contact with a lower surface of the phosphor film 40. An upper surface of the LED chip 20 and the upper surface of the phosphor side layer 60 may be planar and coplanar. A lower surface of the LED chip 20 and a lower surface of the phosphor side layer 60 may be substantially planar. Side surfaces of the phosphor film 40 and side surfaces of the phosphor side layer 60 may be planar and vertically aligned. The phosphor side layer 60 may include the same material as the phosphor film 40. When the phosphor side layer 60 and the phosphor film 40 include the same material, a boundary therebetween may disappear.

A vertical thickness T3 of the phosphor side layer 60 may be substantially the same as the reflective side layer 30.

In the white LED device 12*a* in accordance with the embodiment of the disclosure, since light emitted and lost in a lateral direction of the LED chip 20 is used as an effective light by the phosphor side layer 60, an effective light emitting angle is improved to about 130°.

Figure 14A:
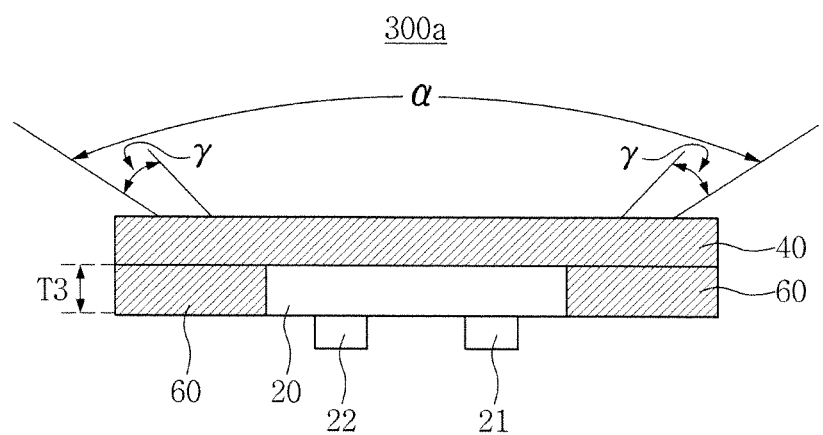
FIGS. 14A and 14B show illumination angles of light emitted from white LED devices.

Referring to FIG. 14A, in certain embodiments of the white LED device 300*a*, the light emitting device has a light emitting angle α. In certain embodiments there may be some yellowing of the white light at peripheral portions γ of the light emitting angle α.

Figure 14B:
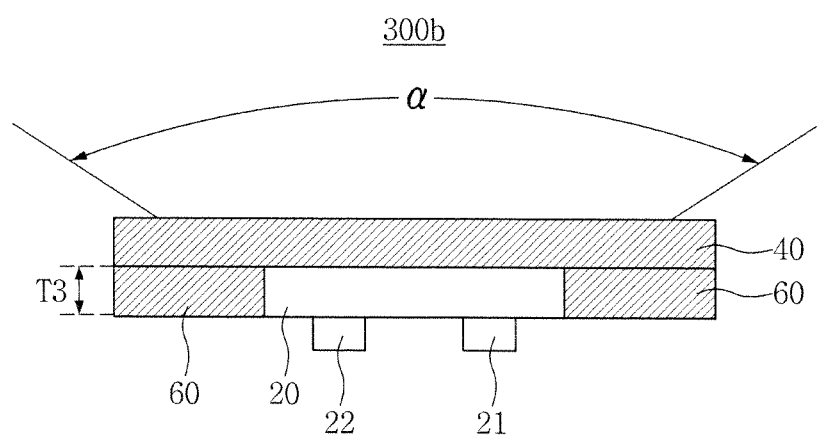

In certain embodiments of the white LED device 300*b*, peripheral yellowing is prevented, thereby providing white light across the entire light emitting angle α, as shown in FIG. 14B, by forming phosphor film 40 and the phosphor side layer 60 having different densities. In certain embodiments, the density of the phosphor side layer may be less than the density of the phosphor film. The density of the phosphor side layer may be about 35-50% the density of the phosphor film.

Figure 3B:
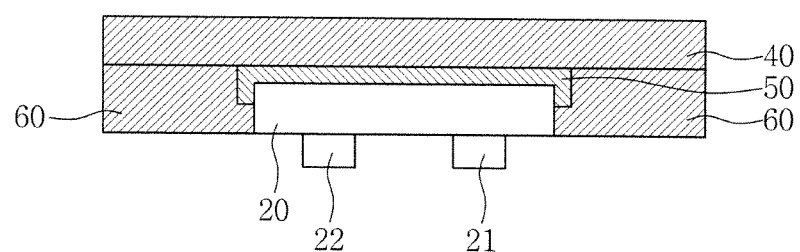

Referring to FIG. 3B, a white LED device 13*b* in accordance with an exemplary embodiment of the disclosure may include an LED chip 20, a phosphor film 40, a phosphor side layer 60, and a buffer layer 50 disposed between the LED chip 20 and the phosphor film 40.

Figure 3C:
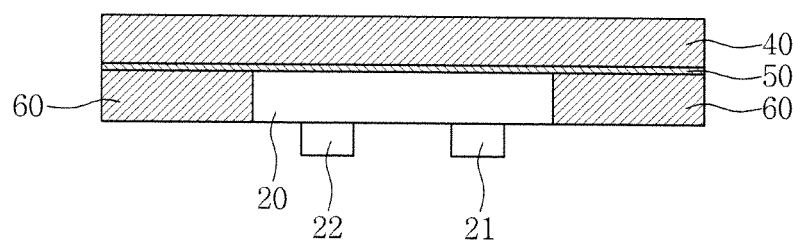

Referring to FIG. 3C, a white LED device 13c in accordance with an exemplary embodiment of the disclosure may include an LED chip 20, a phosphor film 40, a phosphor side layer 60, and a buffer layer 50 disposed between the LED chip 20 and the phosphor film 40, and between the phosphor side layer 60 and the phosphor film 40.

Figure 3D:
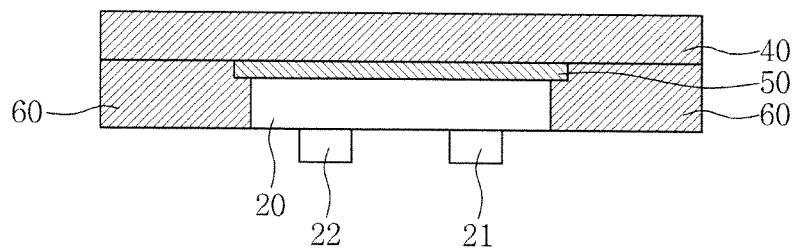

Referring to FIG. 3D, a white LED device 13d in accordance with an exemplary embodiment of the disclosure may include an LED chip 20, a phosphor film 40, a phosphor side layer 60, and a buffer layer 50 disposed between the LED chip 20 and the phosphor film 40.

Figure 3E:
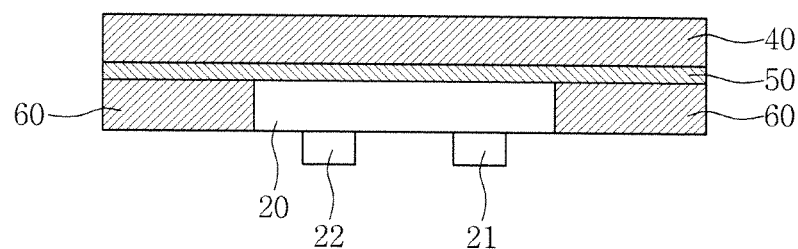

Referring to FIG. 3E, a white LED device 13e in accordance with an exemplary embodiment of the disclosure may include an LED chip 20, a phosphor film 40, a phosphor side layer 60, and a buffer layer 50 disposed between the LED chip 20 and the phosphor film 40, and between the phosphor side layer 60 and the phosphor film 40.

Figure 4A:
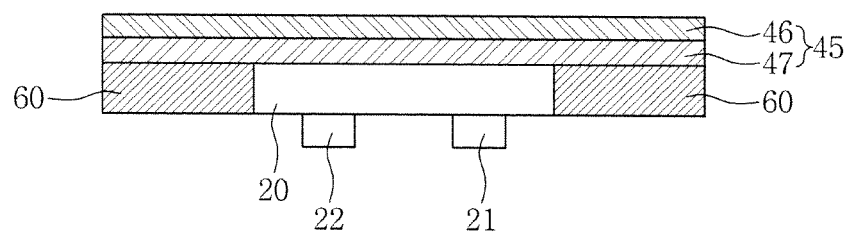

Referring to FIG. 4A, a white LED device 14a in accordance with an exemplary embodiment of the disclosure may include an LED chip 20, a multilayered phosphor film 45, and a phosphor side layer 60.

Figure 4B:
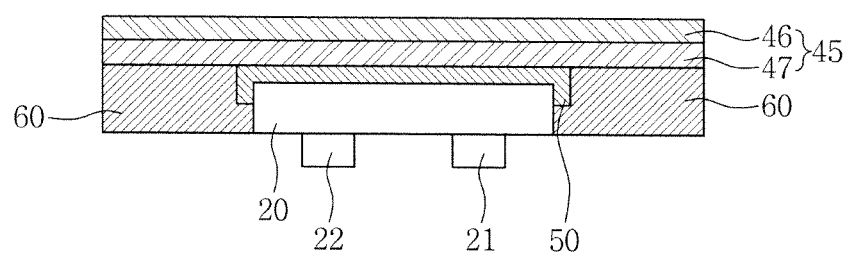

Referring to FIG. 4B, a white LED device 14b in accordance with an exemplary embodiment of the disclosure may include an LED chip 20, a multilayered phosphor film 45, a phosphor side layer 60, and a buffer layer 50 disposed between the LED chip 20 and the multilayered phosphor film 45.

Figure 4C:
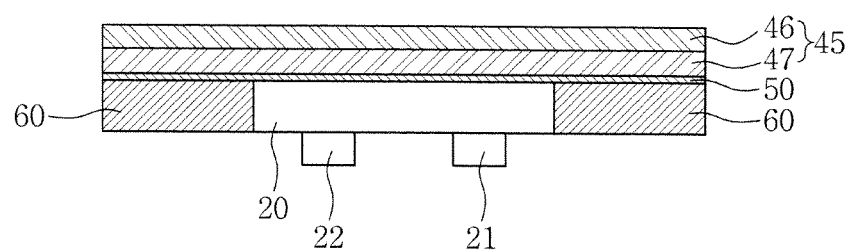

Referring to FIG. 4C, a white LED device 14c in accordance with an exemplary embodiment of the disclosure may include an LED chip 20, a multilayered phosphor film 45, a phosphor side layer 60, and a buffer layer 50 disposed between the LED chip 20 and the multilayered phosphor film 45, and between the phosphor side layer 60 and the multilayered phosphor film 45.

Figure 4D:
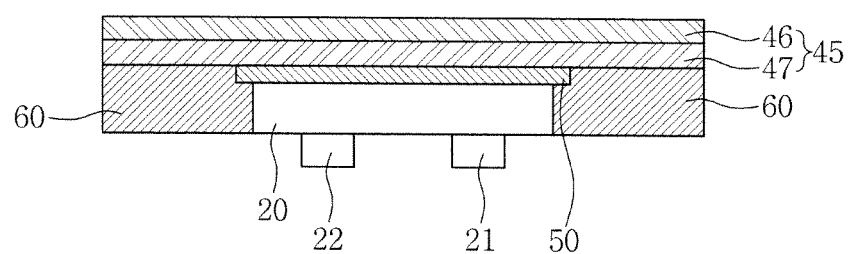

Referring to FIG. 4D, a white LED device 14d in accordance with an exemplary embodiment of the disclosure may include an LED chip 20, a multilayered phosphor film 45, a phosphor side layer 60, and a buffer layer 50 disposed between the LED chip 20 and the multilayered phosphor film 45.

Figure 4E:
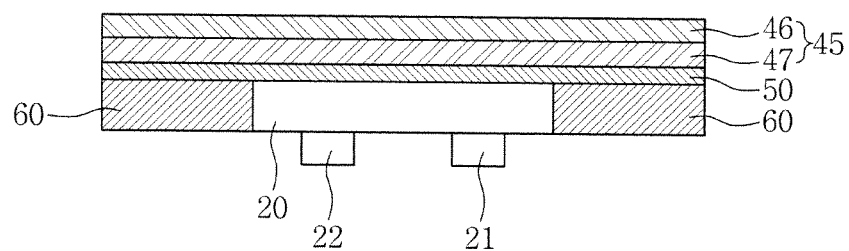

Referring to FIG. 4E, a white LED device 14e in accordance with an exemplary embodiment of the disclosure may include an LED chip 20, a multilayered phosphor film 45, a phosphor side layer 60, and a buffer layer 50 disposed between the LED chip 20 and the multilayered phosphor film 45, and between the phosphor side layer 60 and the multilayered phosphor film 45.

Since the white LED devices 11a to 14e in accordance with various embodiments of the disclosure include a reflective side layer 30 or a phosphor side layer 60 formed on side surfaces of the LED chips 20, light generation efficiency is excellent. For example, since light emitted from the LED chip 20 in a lateral direction is reflected by the reflective side layer 30 or emitted by the phosphor side layer 60, intensity of light emitted outward from the LED chip may increase.

In the white LED devices 11a to 14e in accordance with all embodiments shown in FIGS. 1A to 4E, the electrodes 21 and 22 may be planar and coplanar with the lower surface (or upper surface) of the LED chip 20, or buried such that the surfaces of the electrodes 21 and 22 are recessed from the lower surface of the LED chip 20. When the electrodes 21 and 22 are buried, reference numerals 21 and 22 may indicate bumps.

The white LED devices 11a to 14e in accordance with all embodiments shown in FIGS. 1A to 4E may include a lens (not shown) disposed on the phosphor film 40 so as to obtain a preferred shape of light distribution at a light-emitting side. The lens may fully cover the upper surface of the phosphor film 40. The lens may include a transparent material, such as hardened silicon or an organic polymer resin.

Since some of the white LED devices 11a to 14e in accordance with various embodiments of the disclosure include the buffer layer 50, adhesive strengths of the LED chip 20, the phosphor film 40, the reflective side layer 30, and/or the phosphor side layer 60 are improved, and thus physical, mechanical, thermal, and electrical characteristics are improved, and life span increases.

Since some of the white LED devices 11a to 14e in accordance with various embodiments of the disclosure include the buffer layer 50, the phosphor film 40 are less affected by heat generated from the LED chip 20.

By adjusting the refractive index of the phosphor film 40 and the buffer layer 50, emission efficiency of light generated from the LED chip 20 may increase.

FIGS. 5A to 12B are views for describing various methods of fabricating white LED devices in accordance with various embodiments of the disclosure.

Figure 5A:
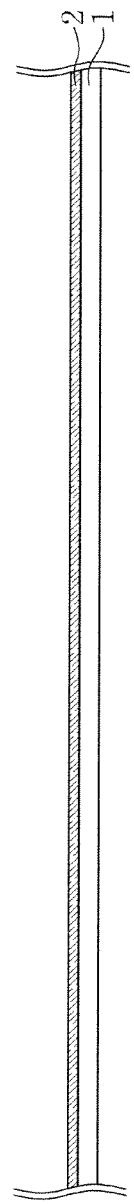
FIGS. 5A to 12B are views for describing various methods of fabricating white LED devices in accordance with various embodiments of the disclosure.

Referring to FIG. 5A, a method of fabricating a white LED device in accordance with an exemplary embodiment of the disclosure may include forming a releasing layer 2 on a supporting substrate 1. The supporting substrate 1 may include a transparent polymer compound. For example, the supporting substrate 1 may include polyethylene terephthalate (PET). In other embodiment, the supporting substrate 1 may include a hard film, such as glass. The releasing layer 2 may include fluorine (F). For example, the forming the releasing layer 2 may include coating a material containing fluorine (F) on the supporting substrate 1. In other embodiments, the releasing layer 2 may be omitted.

Figure 5B:
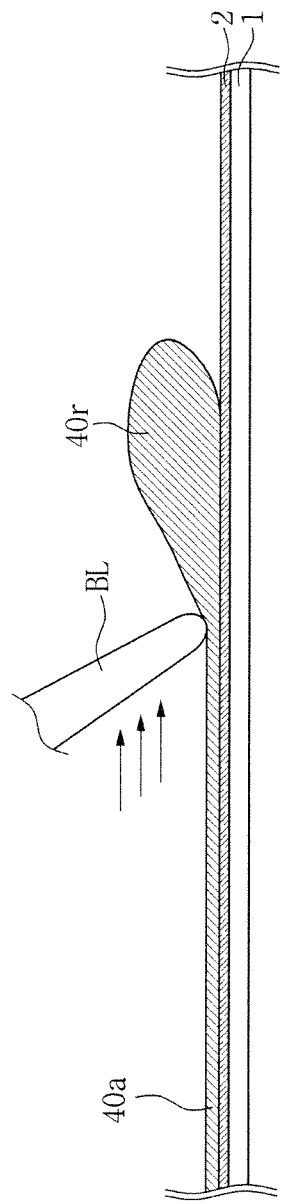

Referring to FIG. 5B, the method may include forming a phosphor layer 40a on the releasing layer 2 of the supporting substrate 1. The forming the phosphor layer 40a may include providing a paste-state phosphor resin 40r on the releasing layer 2, and forming the phosphor resin 40r in an appropriate thickness on the releasing layer 2 of the supporting substrate 1 using a blade BL. In addition, the phosphor layer 40a may be formed by a spreading and plasting method. The phosphor layer 40a and/or the phosphor resin 40r may include a phosphor powder, silicon, and a solvent. In other embodiments, the phosphor resin 40r may be a form of a tape or sheet having softness. Accordingly, the phosphor layer 40a may be directly formed in the form of a film on the releasing layer 2 of the supporting substrate 1. In this embodiment, the phosphor layer 40a may include a yellow phosphor material.

Figure 5C:
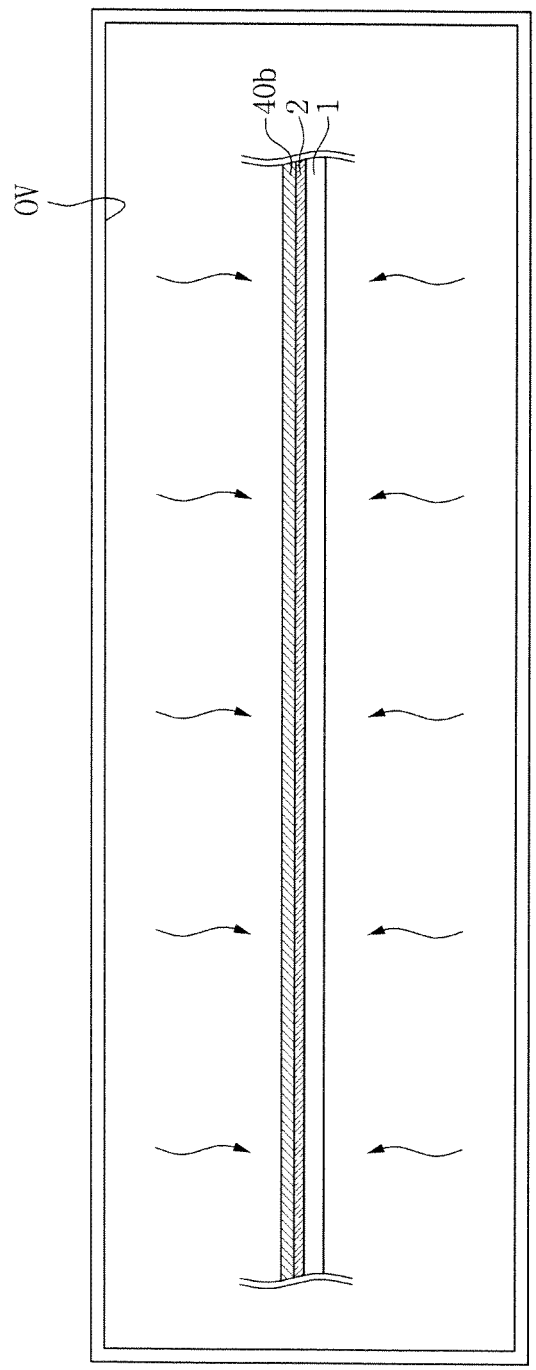

Referring to FIG. 5C, the method may include pre-curing the phosphor layer 40a. The pre-curing of the phosphor layer 40a may include loading the supporting substrate 1 on which the phosphor layer 40a is formed into a curing oven OV, and heating for several tens of minutes. For example, the phosphor layer 40a may be heated at about 125 t for about 30 minutes in the curing oven OV. In this process, the solvent component in the phosphor layer 40a may be partially removed, and thus the phosphor layer 40a may be cured and converted into a soft pre-cured phosphor layer 40b. In another embodiment, when the phosphor resin 40r is a form of a tape or a sheet, this process may be substantially omitted. The pre-cured phosphor layer 40b may have a thickness of about 100 μm.

Figure 5D:
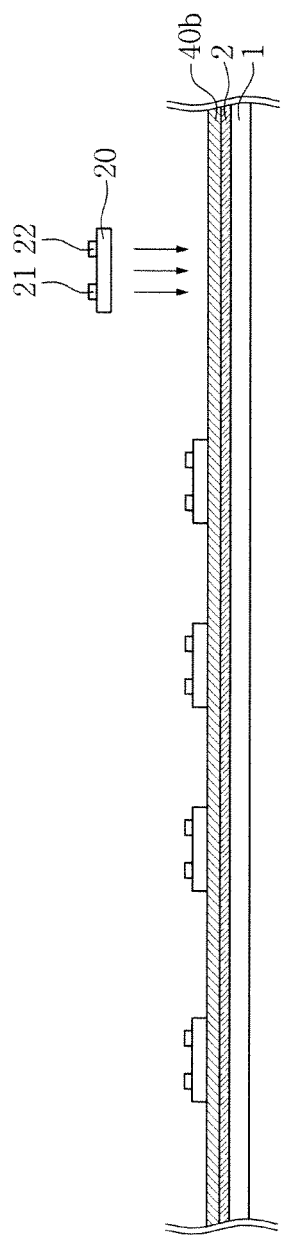

Referring to FIG. 5D, the method may include arranging and mounting a plurality of LED chips 20 on the pre-cured phosphor layer 40b of the supporting substrate 1. The arranging and mounting of the LED chips 20 may include lightly pressing and attaching the LED chip 20 on the pre-cured phosphor layer 40b. (+)/(−) electrodes 21 and 22 may be disposed on a surface of each of the LED chips 20. The plurality of LED chips 20 may include blue LED chips which generate blue light. The LED chips 20 may be singulated from a wafer state to a single chip state through a dicing process.

Figure 5E:
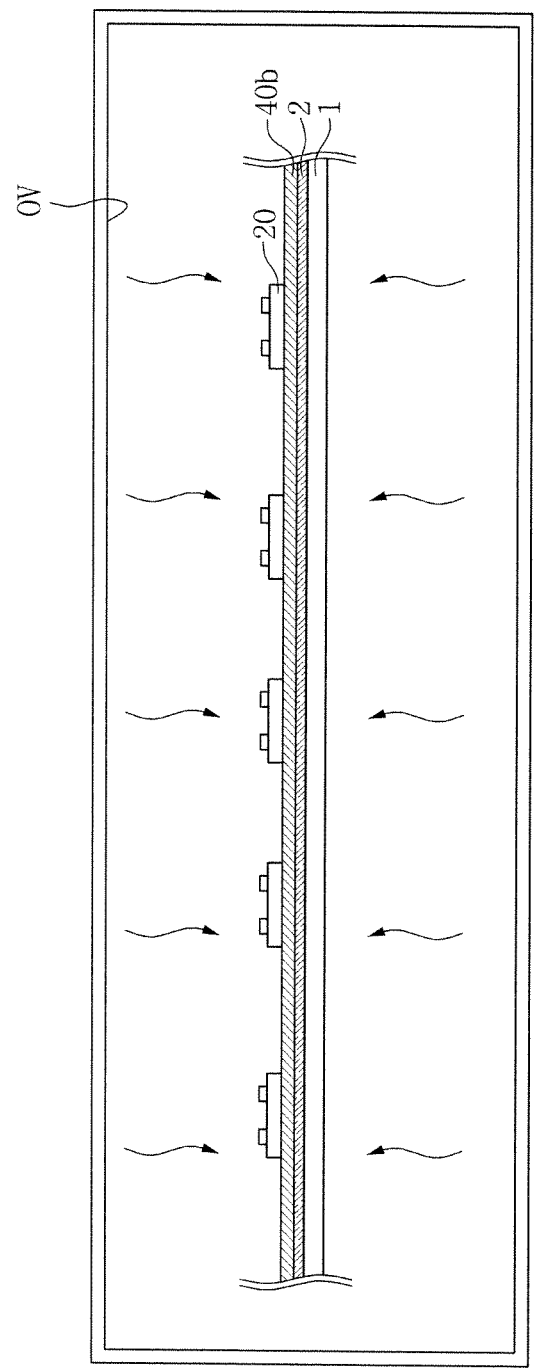

Referring to FIG. 5E, the method may include fully curing the pre-cured phosphor layer 40b on which the LED chips 20 are arranged. The fully curing of the pre-cured phosphor layer 40b may include further heating the pre-cured phosphor layer 40b in the curing oven OV for several tens of minutes. For example, the pre-cured phosphor layer 40b may be further heated in the curing oven OV at about 150° C. for about 20 minutes. In this process, the solvent components in the pre-cured phosphor layer 40b may be substantially fully removed, and thus the pre-cured phosphor layer 40b may be fully cured and converted to a hard cured phosphor film 40. In other embodiments, the phosphor film 40 may be a form of a sheet.

Figure 5F:
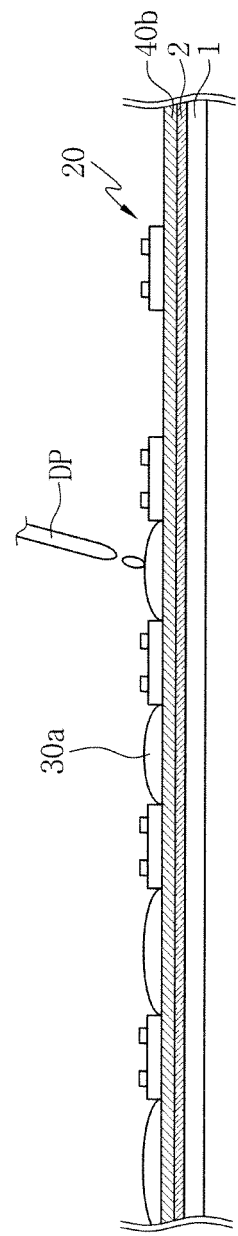

Referring to FIG. 5F, the method may include providing a reflective side material 30a between the LED chips 20 on the phosphor film 40. Thy providing of the reflective side material 30a may include dispensing the reflective side material 30a having fluidity between the LED chips 20 using a dispenser DP such as a nozzle, etc. The reflective side material 30a may include a reflective material and a base resin in a ratio of about 40:60. For example, the reflective material may include a white-colored metal oxide powder, such as $TiO_2$, $Al_2O_3$, or $ZrO_3$, and the base resin may include a transparent material such as silicon. The reflective side material 30a may further include a solvent to obtain fluidity or viscosity. The reflective side material 30a may have viscosity of about 1500 to 2000 centipoises (cP). An upper surface of the viscous reflective side material 30a may become substantially flat over time.

Figure 5G:
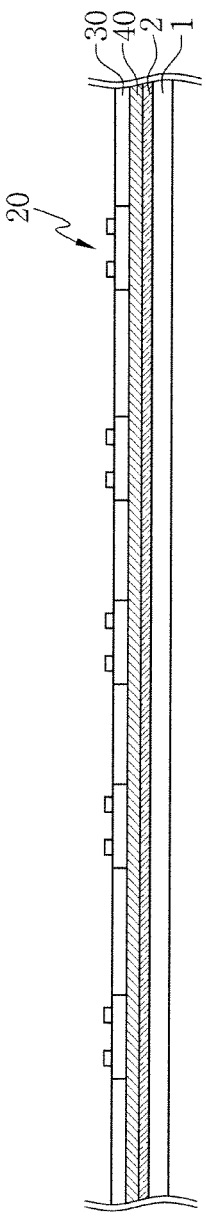

Referring to FIG. 5G, the method may include forming a reflective side layer 30 by curing the reflective side material 30a. The curing of the reflective side material 30a may include heating the reflective side material 30a at about 170° C. for about 30 minutes in the curing oven OV. In this process, the solvent components in the reflective side material 30a may be substantially fully removed, and thus the reflective side material 30a may be cured to be the solid-state reflective side layer 30. An upper surface of the reflective side layer 30 may be substantially planar with or have a similar height to upper surfaces of the LED chips 20.

Figure 5H:
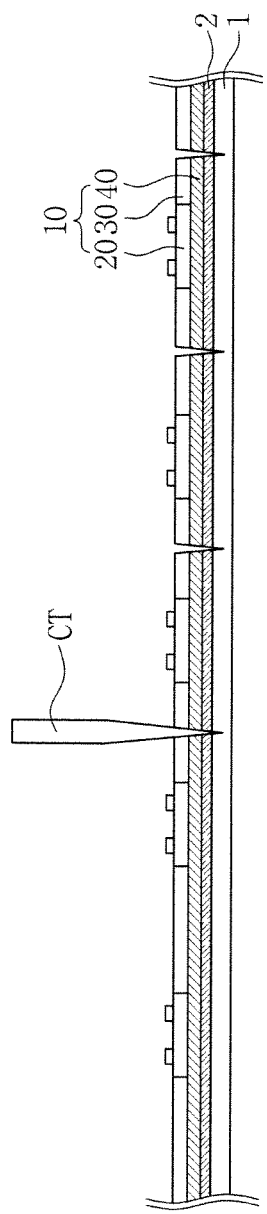

Referring to FIG. 5H, the method may include performing a singulation process in which the reflective side layer 30 is diced. Thereby, each of the LED chips 20 are diced and separated into white LED devices 10. The white LED device 10 may include the LED chip 20, the reflective side layer 30 surrounding side surfaces of the LED chip 20, and the phosphor film 40 disposed on a lower surface of the LED chip 20 and a lower surface of the reflective side layer 30. In a top view, the reflective side layer 30 may fully surround four side surfaces of the LED chip 20. The singulation process may include cutting the reflective side layer 30, the phosphor film 40, and the releasing layer 2, and partially cutting the supporting substrate 1, using a cutter CT or a blade.

Figure 5I:
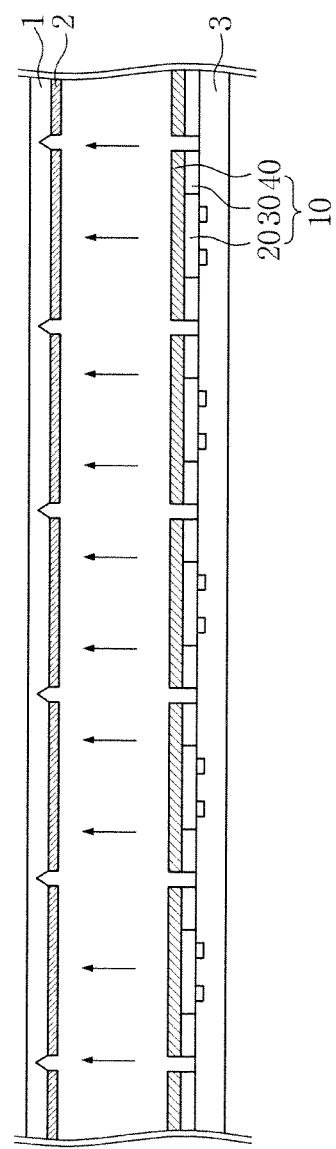
Figure 5J:
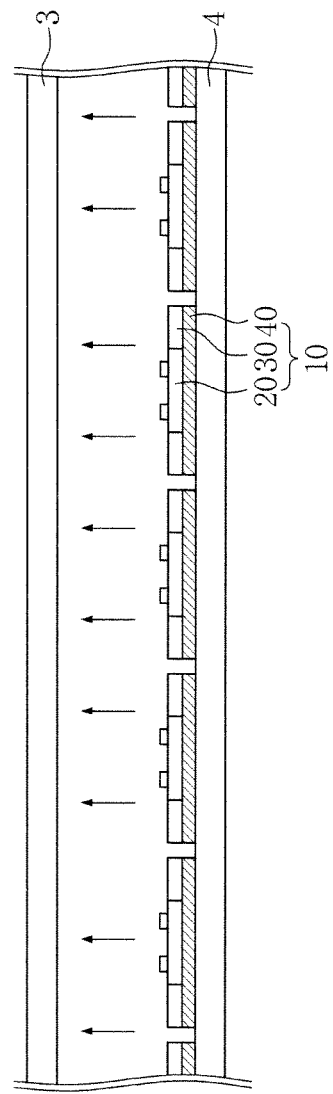

Referring to FIGS. 5I and 5J, the method may include replacing the supporting substrate 1 with a transfer substrate 4 by performing a transfer process.

Referring to FIG. 5I, the transfer process may include attaching a transitional substrate 3 on the LED chips 20 and the reflective side layers 30 such that the transitional substrate 3 is opposite to the supporting substrate 1, and physically separating the phosphor film 40 from the releasing layer 2 on the supporting substrate 1. The transitional substrate 3 may include an acryl-based resin or a polymer compound which has a higher flexibility and thermal expansion than the supporting substrate 1. The process may be performed in a state in which the supporting substrate 1 and the white LED devices 10 are overturned such that the white LED chips 20 face down.

Referring to FIG. 5J, the transfer process may include attaching the transfer substrate 4 on the phosphor film 40, and separating the transitional substrate 3. The transfer substrate 4 may also include an acryl-based resin or a polymer compound which has a higher flexibility and thermal expansion than the supporting substrate 1. The process may be performed in a state in which the transitional substrate 3 and the white LED devices 10 are overturned such that the LED chips 20 face up.

Figure 5K:
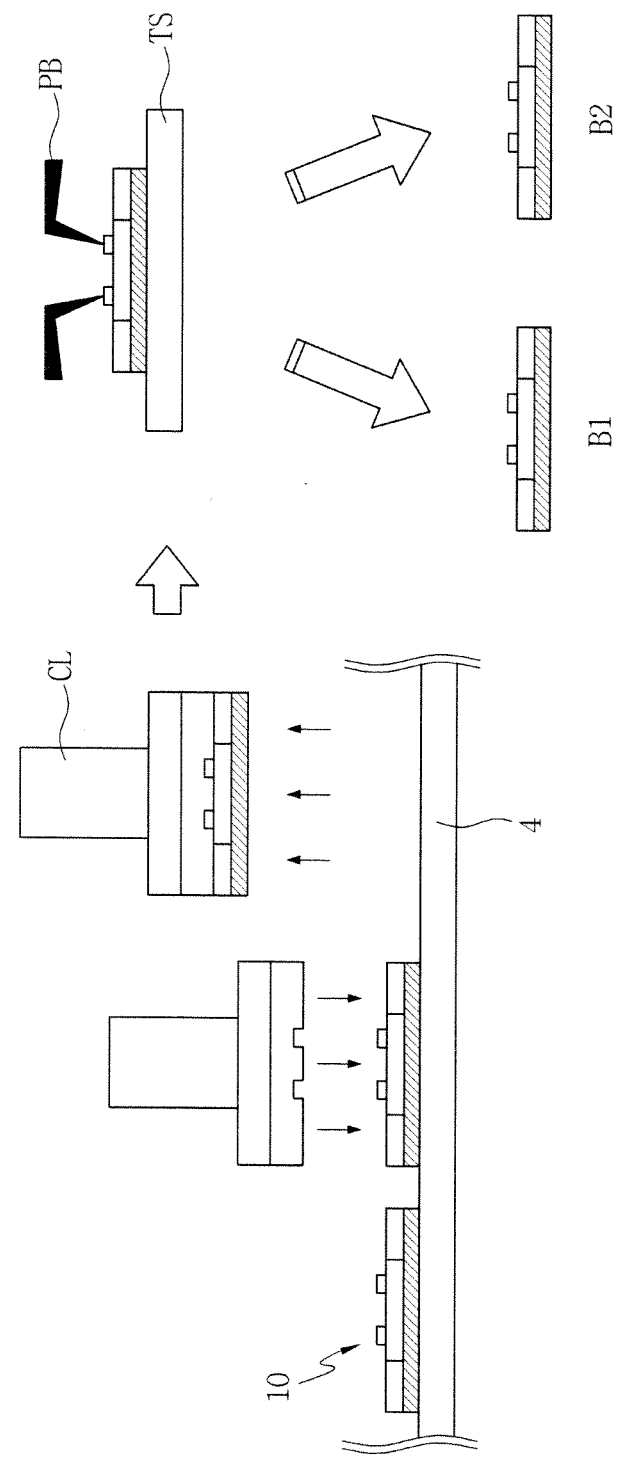

Referring to FIG. 5K, the method may further include testing the white LED device 10. The test of the white LED device 10 may include picking up and transferring the white LED device 10 to a test system TS using a collet CL, and testing electrical and optical properties of the white LED devices 10 by contacting probes PB onto the electrodes 21 and 22 of the LED chips 20 of the white LED device 10 on the test system TS. Next, the method may include listing non-defective goods B1 and defective goods B2 depending on the result of the test.

Figure 5L:
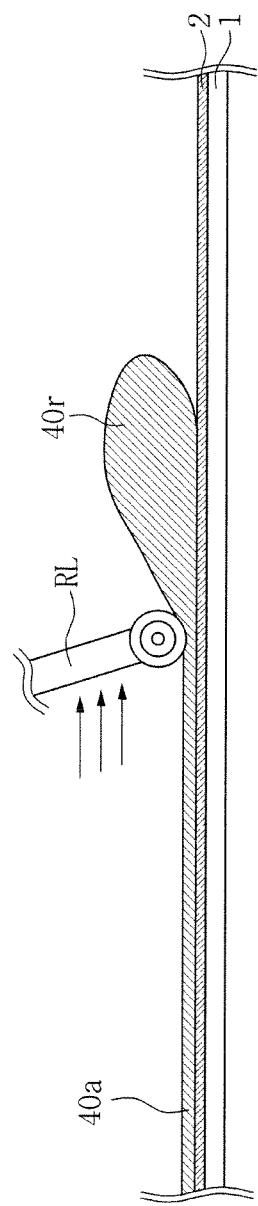

FIG. 5L is a view for describing another method of forming the phosphor layer 40a on the releasing layer 2, with reference further to FIG. 5B. The forming the phosphor layer 40a may include providing a phosphor resin 40r on the releasing layer 2, and spreading and plasting the phosphor resin 40r in an appropriate thickness on the releasing layer 2 of the supporting substrate 1 using a roller RL.

Figure 6A:
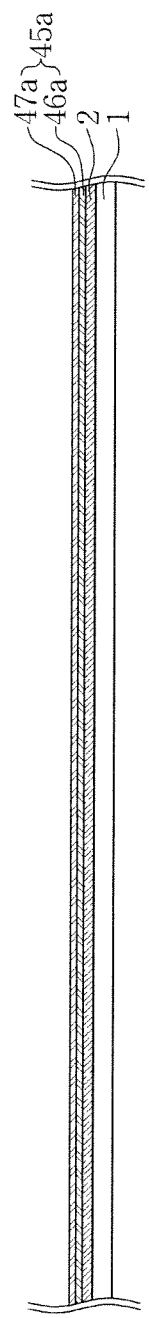

Referring to FIG. 6A, a method of fabricating white LED devices in accordance with an exemplary embodiment of the disclosure may include, with reference further to FIGS. 5A and 5B, forming a releasing layer 2 on a supporting substrate 1, and stacking a multilayered phosphor layer 45a including a first phosphor layer 46a and a second phosphor layer 47a on the releasing layer 2. For example, the first phosphor layer 46a may be directly formed on the releasing layer 2 of the supporting substrate 1, and the second phosphor layer 47a may be directly formed on the first phosphor layer 46a. The first phosphor layer 46a may include a green phosphor material, and the second phosphor layer 47a may include a red phosphor material. The first phosphor layer 46a and the second phosphor layer 47a may include one of a CaSiN phosphor material, an yttrium aluminum garnet (YAG) phosphor material, and/or a silicate phosphor material. Each of the first phosphor layer 46a and/or the second phosphor layer 47a may be provided in a form of a resin, a film, or a sheet.

The method may include, by fully or selectively performing the processes with reference to FIGS. 2A, and 5C to 5K, pre-curing the first phosphor layer 46a and the second phosphor layer 47a, arranging and mounting a plurality of LED chips 20 on the pre-cured second phosphor layer 47a, forming a first phosphor film 46 and a second phosphor film 47 by fully curing the pre-cured first phosphor layer 46a and the pre-cured second phosphor layer 47a, providing a reflective side material 30a between the LED chips 20, forming a reflective side layer 30 by curing the reflective side material 30a, and/or cutting each of the LED chips 20 to be separated into white LED devices 10 by performing a singulation process.

The method may further include, with reference further to FIGS. 5I to 5L, and 6B, replacing the supporting substrate 1 with a transfer substrate 4, picking up and transferring the white LED devices 10 to a test system TS using a collet CL, and classifying the white LED devices 10 into non-defective goods B1 and defective goods B2 by testing electrical and optical properties of the white LED device 10 on the test system TS using a probe PB, etc.

Figure 7A:
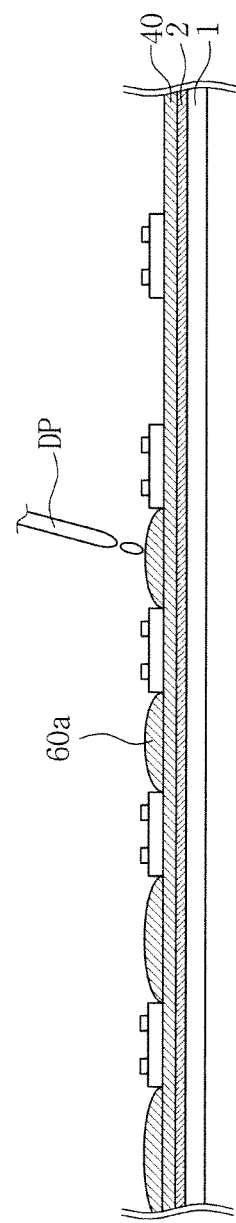

Referring to FIG. 7A, a method of fabricating white LED devices in accordance with an exemplary embodiment of the disclosure may include, with reference further to FIGS. 5A to 5F, forming a releasing layer 2 on a supporting substrate 1, forming a phosphor layer 40a on the releasing layer 2, pre-curing the phosphor layer 40a, arranging and mounting a plurality of LED chips 20 on the pre-cured phosphor layer 40b, fully curing the pre-cured phosphor layer 40b to form a phosphor film 40, and providing a phosphor side filling material 60a between the LED chips 20 on the phosphor film 40.

The phosphor side filling material 60a may include a phosphor powder, silicon, and a solvent. The phosphor side filling material 60a may include a yellow phosphor material, or a green-red mixed phosphor material, etc. For example, the phosphor side filling material 60a may include the same materials as the phosphor resin 40r.

The method may include, with reference further to FIGS. 3A, and 5G to 5H, curing the phosphor side filling material 60a to form a phosphor side layer 60, and cutting each of the LED chips 20 to be separated into white LED devices 10 by performing a singulation process.

Figure 7B:
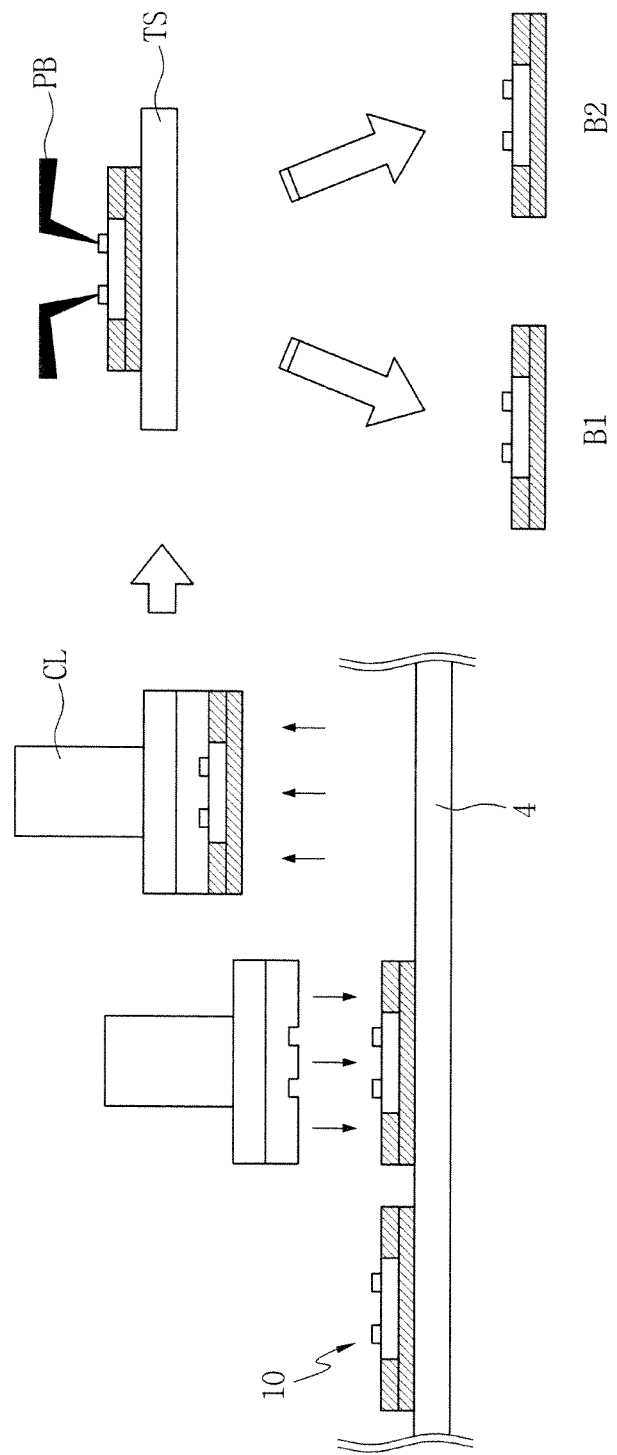

The method may further include, with reference further to FIGS. 5I, 5J, and 7B, replacing the supporting substrate 1 with a transfer substrate 4, picking up and transferring the white LED devices 10 disposed on the transfer substrate 4 to a test system TS using a collet CL, and classifying the white LED device 10 into non-defective goods B1 and defective goods B2 by testing electrical and optical properties of the white LED device 10 using probes PB.

Figure 8A:
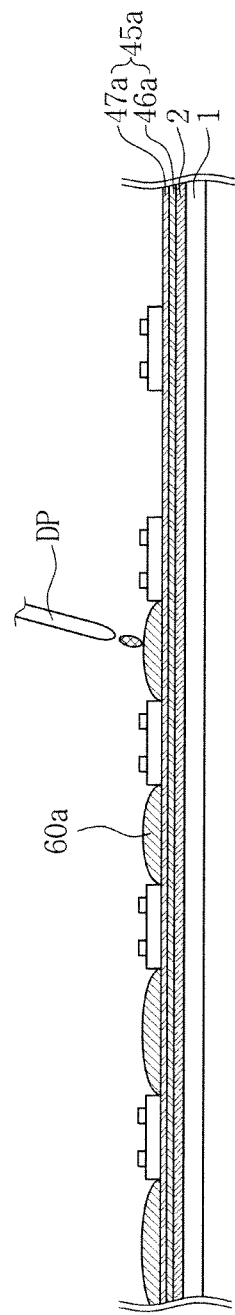

Referring to FIG. 8A, a method of fabricating white LED devices in accordance with an exemplary embodiment of the disclosure may include, with reference further to FIGS. 5A to 5F, 6A, and 7A, forming a releasing layer 2 on a supporting substrate 1, stacking a multilayered phosphor layer 45a including a first phosphor layer 46a and a second phosphor layer 47a on the releasing layer 2, pre-curing the multilayered phosphor layer 45a, arranging and mounting a plurality of LED chips 20 on the pre-cured second phosphor layer 47a, fully curing the pre-cured phosphor layer 45a to form a phosphor film 40, and providing a phosphor side filling material 60a between the LED chips 20 on the phosphor film 40.

The method may include, with reference further to FIGS. 4A, and 5G to 5H, curing the phosphor side filling material 60a, and cutting each of the LED chips 20 to be separated into white LED devices 10 by performing a singulation process.

Figure 8B:
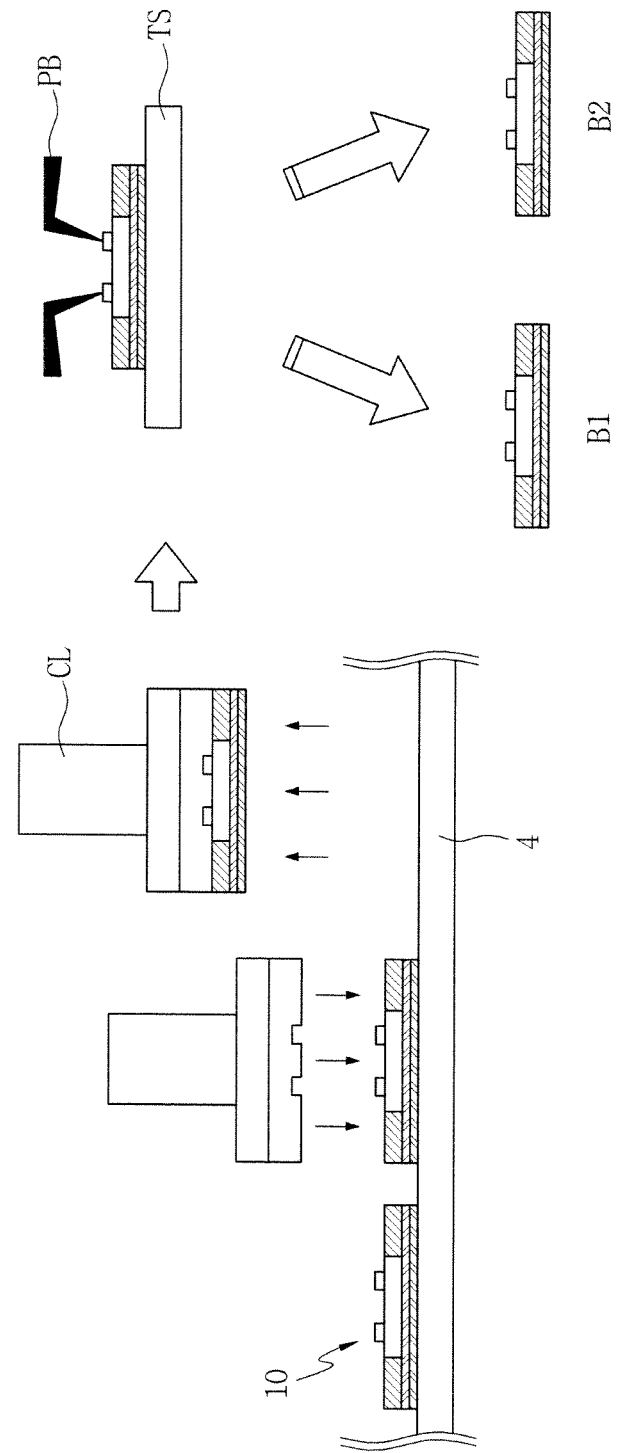

The method may further include, with reference to FIGS. 5I, 5J, and 8B, replacing the supporting substrate 1 with a transfer substrate 4, picking up and transferring the white LED devices 10 disposed on the transfer substrate 4 to a test system TS using a collet CL, and classifying the white LED devices 10 into non-defective goods B1 and defective goods B2 by testing electrical and optical properties of the white LED device 10 using probes PB on the test system TS.

Figure 9A:
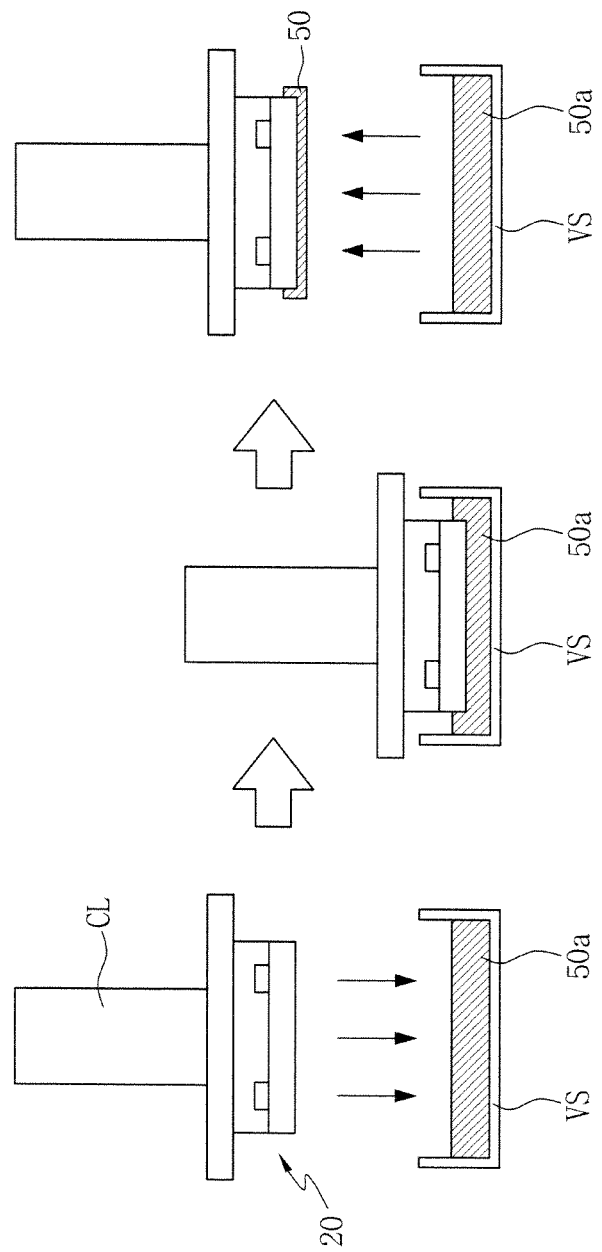
Figure 9B:
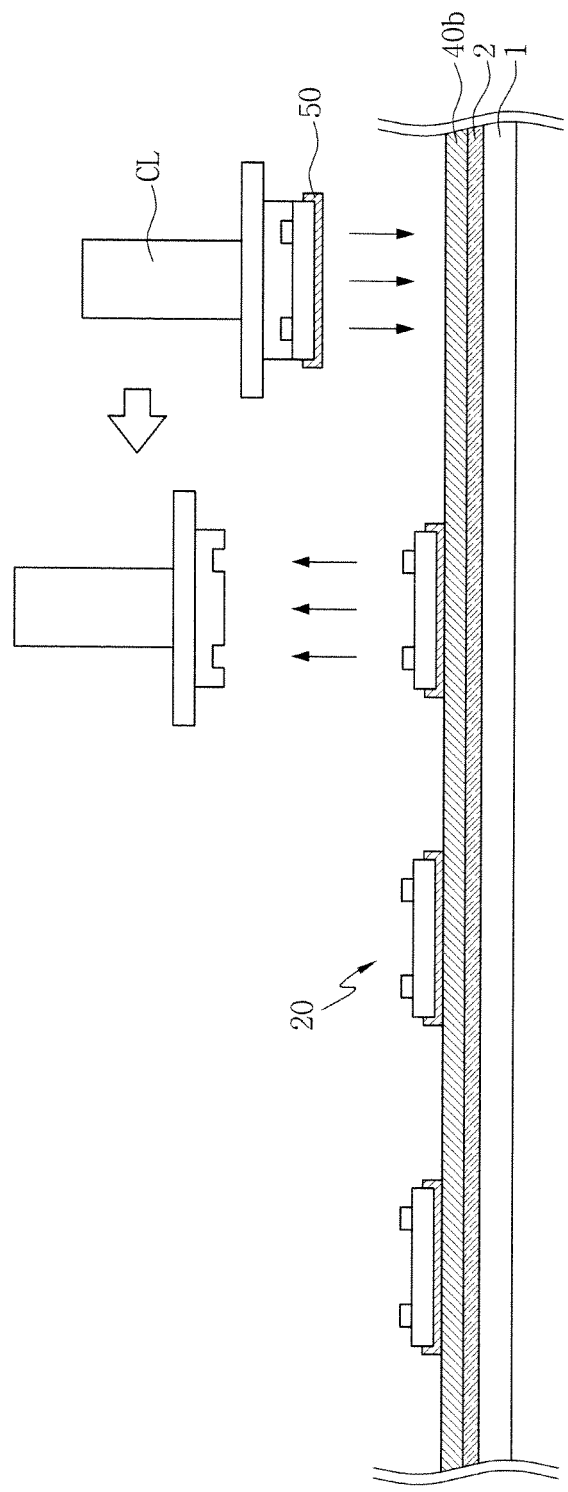

Referring to FIG. 9A, a method of fabricating white LED devices in accordance with an exemplary embodiment of the disclosure may include partly forming a buffer layer 50 on parts of surfaces of the LED chips 20. The forming the buffer layer 50 may include partially dipping the LED chips 20 in a vessel VS which contains a buffer material 50a, to form the buffer layer 50 on the entire lower surface and parts of side surfaces of the LED chip 20. The buffer material 50a may include adhesive silicon resin. The buffer material 50a may be a liquid state having an appropriate fluidity, or a paste state having an appropriate viscosity.

The method may include, with reference to FIGS. 5A to 5D, and 9B, arranging and mounting the LED chips 20 having the buffer layer 50 on the pre-cured phosphor layer 40b.

Figure 9C:
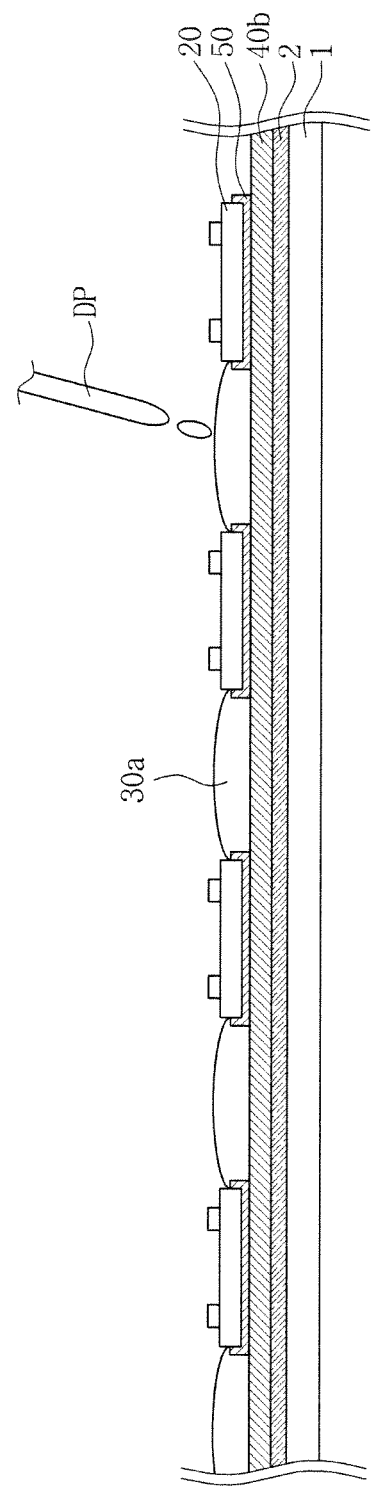

The method may include, with reference to FIGS. 5E and 9C, fully curing the pre-cured phosphor layer 40b, and providing a reflective side material 30a between the LED chips 20.

The method may include, with reference further to FIGS. 5G and 5H, curing the reflective side material 30a to form a reflective side layer 30, and cutting each of the LED chips 20 to be separated into white LED devices 10 by performing a singulation process.

The method may further include, with reference further to FIGS. 5I to 5K, replacing the supporting substrate 1 with a transfer substrate 4, picking up and transferring the white LED devices 10 disposed on the transfer substrate 4 to a test system TS using a collet CL, and classifying the white LED devices 10 into non-defective goods B1 and defective goods B2 by testing electrical and optical properties of the white LED device 10 using probes PB on the test system TS.

Figure 10A:
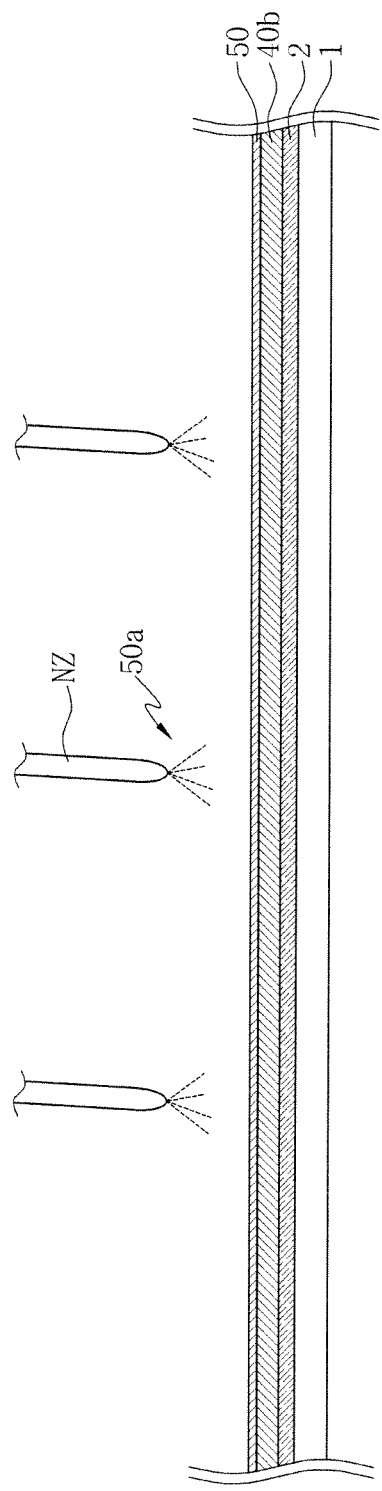

Referring to FIG. 10A, a method of fabricating white LED devices in accordance with an exemplary embodiment of the disclosure may include, with reference to FIGS. 5A to 5C, forming a buffer layer 50 on the pre-cured phosphor layer 40b. The forming the buffer layer 50 may include spraying a buffer material 50a onto the pre-cured phosphor layer 40b by performing a spraying process using a nozzle NZ.

The method may further include drying or heating the buffer material 50a. Accordingly, the buffer material 50a may be dried or heated and converted to the buffer layer 50 in a form of a film or a sheet.

The method may include, with reference to FIGS. 5D and 5E, arranging and mounting the LED chips 20 on the buffer layer 50, and curing the pre-cured phosphor layer 40b and the buffer layer 50.

Figure 10B:
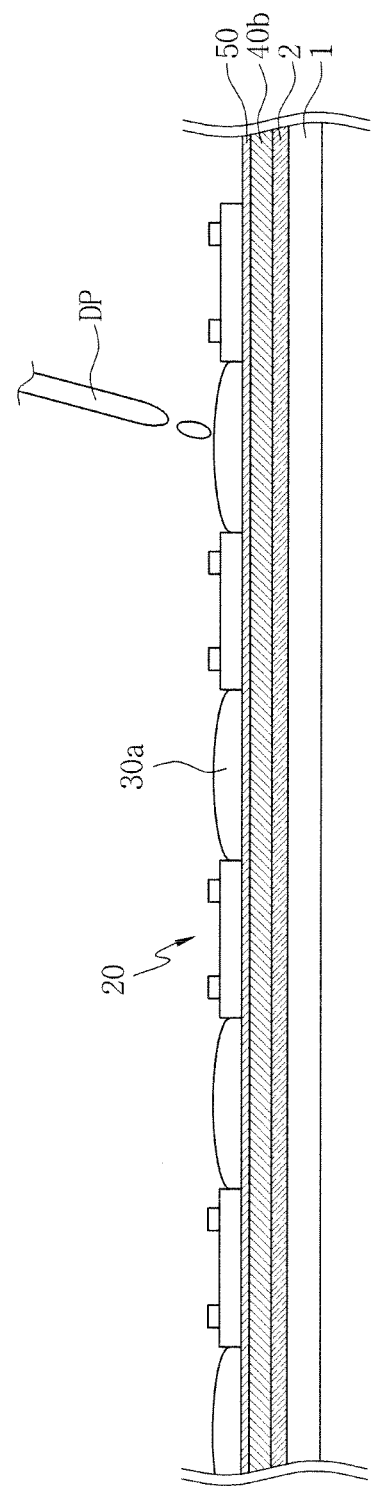

Referring to FIG. 10B, the method may include providing a reflective side material 30a between the LED chips 20 using a dispenser DP, etc.

The method may include, with reference to FIGS. 5G and 5H, curing the reflective side material 30a to form a reflective side layer 30, and cutting each of the LED chips 20 to be separated into white LED devices 10 by performing a singulation process.

The method may further include, with reference to FIGS. 5I to 5K, replacing the supporting substrate 1 with a transfer substrate 4, picking up and transferring the white LED devices 10 disposed on the transfer substrate 4 to a test system TS using a collet CL, and classifying the white LED devices 10 into non-defective goods B1 and defective goods B2 by testing electrical and optical properties of the white LED devices 10 using probes PB on the test system TS.

Figure 11A:
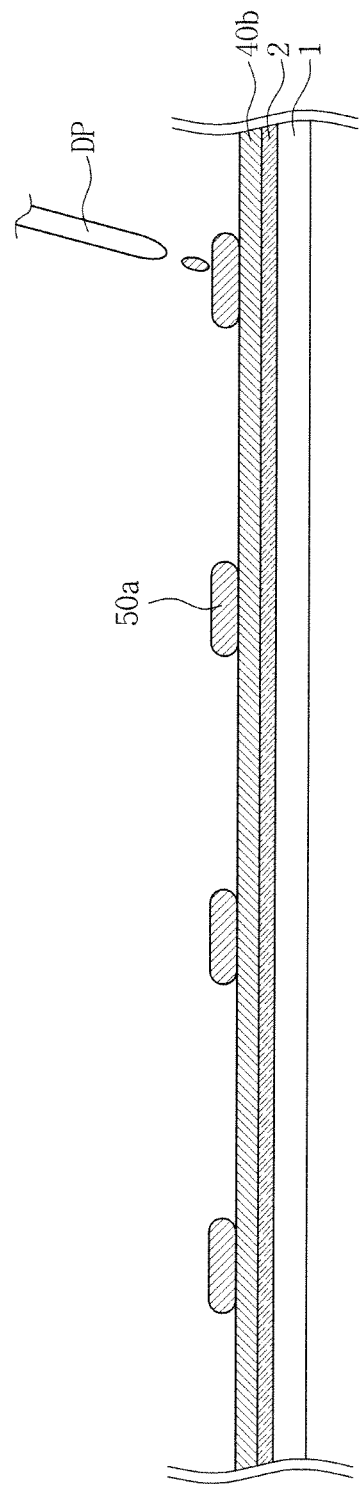

Referring to FIG. 11A, a method of fabricating white LED devices in accordance with an exemplary embodiment of the disclosure may include, with reference to FIGS. 5A to 5C, providing a buffer material 50a on the pre-cured phosphor layer 40b. The supply of the buffer material 50a may include dropping the buffer material 50a in the form of an island on the pre-cured phosphor layer 40b using a dispensing process.

The method may include, with reference to FIGS. 5D and 11B, arranging and mounting the LED chips 20 on the buffer material 50a using a collet CL. The LED chips 20 may be pressed and attached. Accordingly, the buffer material 50a may be spread or plasted on the entire lower surface of the LED chip 20. For example, the buffer material 50a may be converted into a buffer layer 50 having protrusions from side surfaces of the LED chips 20. A process of partially or fully drying the buffer layer 50 may be more performed.

The method may include, with reference to FIGS. 5E to 5H, and 10C, providing a reflective side material 30a between the LED chips, forming a reflective side layer 30 by curing the pre-cured phosphor layer 40b and the buffer layer 50, and cutting each of the LED chips 20 to be separated into white LED devices 10 by performing a singulation process.

The method may further include, with reference FIGS. 5I to 5K, replacing the supporting substrate 1 with a transfer substrate 4, picking up and transferring the white LED devices 10 disposed on the transfer substrate 4 to a test system TS using a collet CL, and classifying the white LED devices 10 into non-defective goods B1 and defective goods B2 by testing electrical and optical properties of the white LED device 10 using probes PB on the test system TS.

Figure 11C:
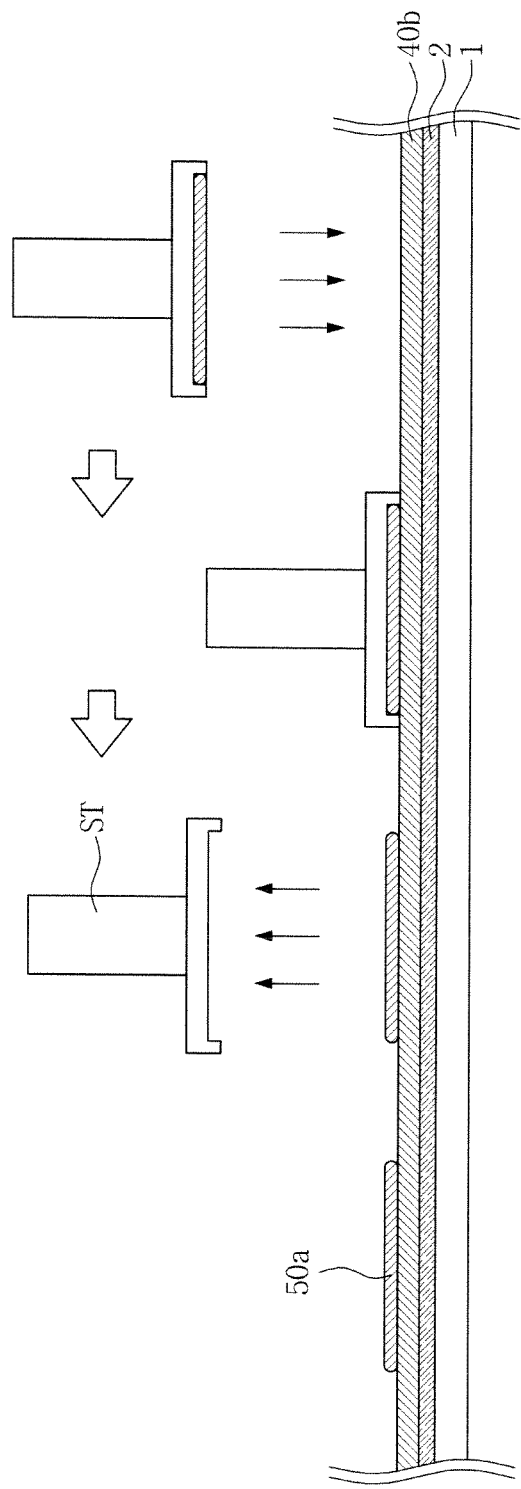

FIG. 11C, compared to FIG. 11A, is a view for describing another method of forming a buffer layer 50 on the pre-cured phosphor layer 40b. Referring to FIG. 11C, the forming the buffer layer 50 may include stamping a buffer material 50a on the pre-cured phosphor layer 40b by performing a stamping process using a stamp ST.

Figure 12A:
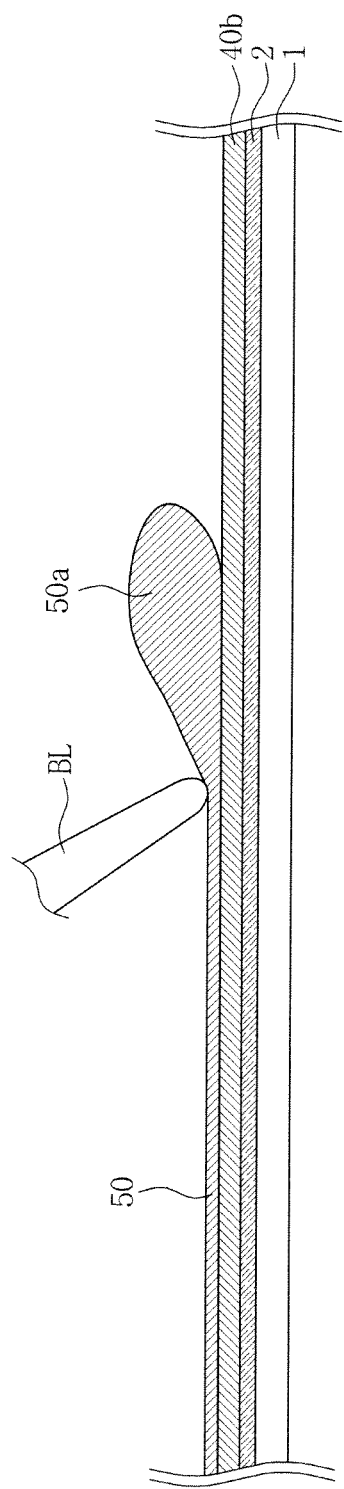
Figure 12B:
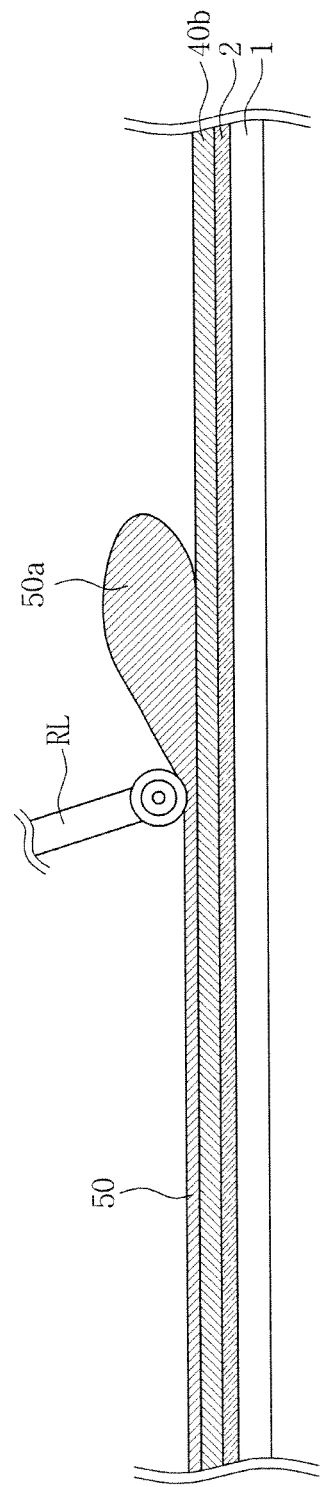

Referring to FIG. 12A or 12B, a method of fabricating white LED devices in accordance with an exemplary embodiment of the disclosure may include, with reference to FIGS. 5A to 5C, providing a buffer material 50a on the pre-cured phosphor layer 40b, and forming a buffer layer 50 by spreading and/or plasting the buffer material 50a using a blade BL or a roller RL.

The method may include, with reference to FIGS. 5D to 5H, arranging and mounting a plurality of LED chips 20 on the buffer layer 50, fully curing the pre-cured phosphor layer 40b, providing a reflective side material 30a between the LED chips 20, forming a reflective side layer 30 by curing the reflective side material 30a, and cutting each of the LED chips 20 to be separated into white LED devices 10.

The method may further include, with reference FIGS. 5I to 5K, replacing the supporting substrate 1 with a transfer substrate 4, picking up and transferring the white LED devices 10 disposed on the transfer substrate 4 to a test system TS using a collet CL, and classifying the white LED devices 10 into non-defective goods B1 and defective goods B2 by testing electrical and optical properties of the white LED device 10 using probes PB on the test system TS.

Regarding to the white LED devices 11a to 14e described in FIGS. 1A to 4E, each of methods of fabricating thereof may be easily anticipated and understood when the various embodiments of the disclosure described with reference to FIGS. 5A to 12B are combined.

Figure 13A:
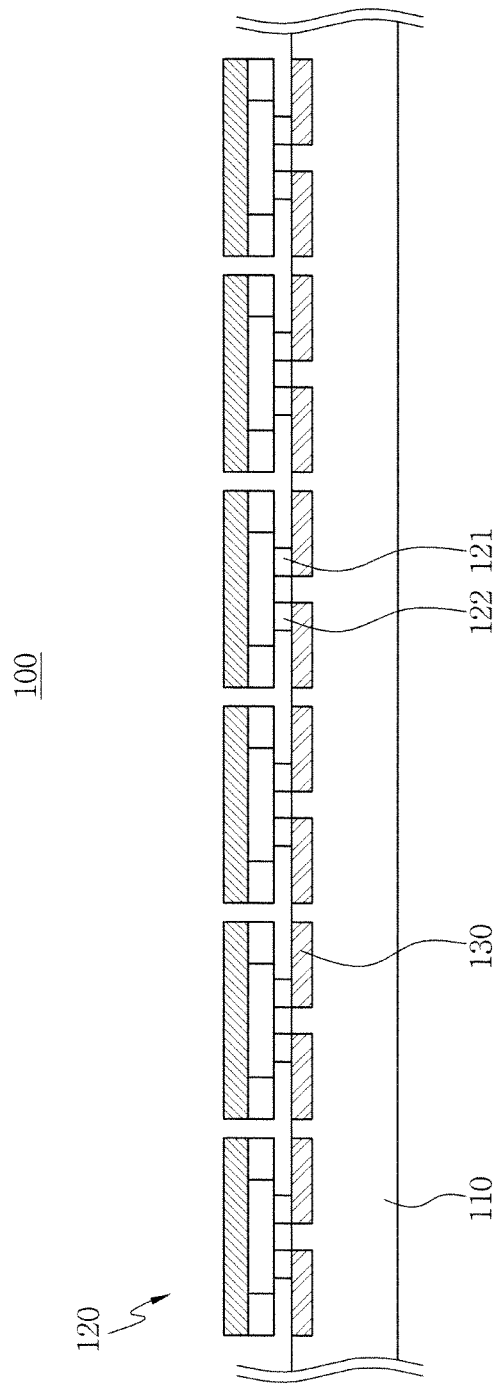
FIG. 13A is a diagram conceptually showing an LED module including at least one of white LED devices in accordance with various embodiments of the disclosure.

FIG. 13A is a diagram conceptually showing an LED module 100 including at least one of the white LED devices 10, and 11a to 14e in accordance with various embodiments of the disclosure. Referring to FIG. 13A, the LED module 100 in accordance with the embodiment of the disclosure may include a plurality of white LED devices 120 arranged on a module substrate 110. The white LED devices 120 may include at least one of the white LED devices 11a to 14e described in FIGS. 1A to 4E. The white LED devices 120 may be arranged on the module substrate 110 using a flip-chip bonding method. Metal interconnections 130 disposed on the module substrate 110 may be in direct contact with the electrodes 121 and 122 of the white LED devices 120. When the electrodes 121 and 122 are buried to be recessed from lower surfaces of the white LED devices 120, the electrodes 121 and 122 may include bumps, such as metal pillars or solder balls.

Figure 13B:
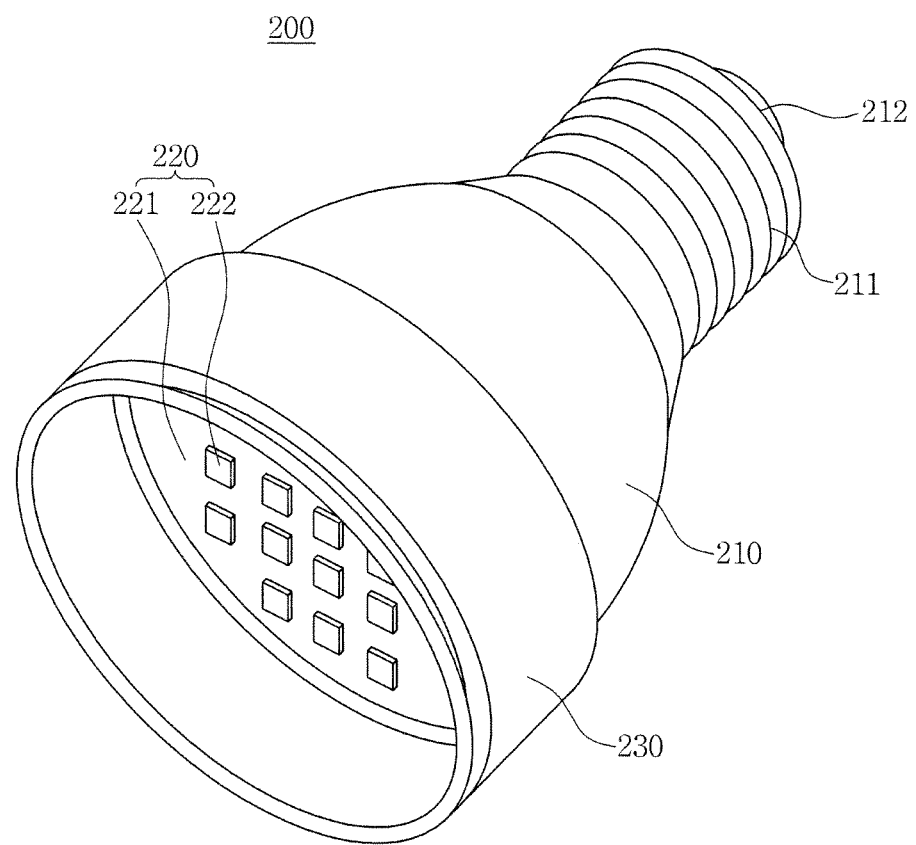
FIG. 13B is a diagram conceptually showing an illumination system including at least one of white LED devices in accordance with various embodiments of the disclosure.

FIG. 13B is a diagram conceptually showing an illumination system 200 including at least one of the white LED devices 11a to 14e in accordance with various embodiments of the disclosure. Referring to FIG. 13B, the illumination system 200 in accordance with the embodiment of the disclosure may include a body 210, an LED module 220, and a reflector 230. The body 210 may include screw-type grooves 211 and an electrode 212 so as to be inserted into a socket, etc. The LED module 220 may include a white LED device 222 disposed on a module substrate 221. The module substrate 221 may include a printed circuit board (PCB), and the white LED device 222 may include one of the white LED devices 11a to 14e in accordance with various embodiments of the disclosure described in FIGS. 1A to 4E. The reflector 230 may increase light efficiency so that light generated from the LED module 220 is irradiated in a direction.

Since the white LED devices in accordance with various embodiments of the disclosure include a reflective side layer or a phosphor side layer formed on side surfaces of LED chips, light generation efficiency is excellent. For example, since light radiated in a lateral direction from an LED chip is reflected by a reflective side layer or emitted by a phosphor side layer, intensity of the light emitted outward from the LED chip increases.

Since the white LED devices in accordance with various embodiments of the disclosure include a buffer layer, adhesion of a LED chip, a phosphor film, and a reflective side layer and/or a phosphor side layer are improved, and the phosphor film is less affected by heat generated from the LED chip. Accordingly, physical, mechanical, thermal, and electrical characteristics of a device are excellent, and life span of a device increases.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this disclosure as defined in the claims. In the claims, means-plus-function clauses are intended to cover the structures described herein as performing the recited function, and not only structural equivalents but also equivalent structures.

What is claimed is:

1. A light emitting device comprising:
an LED chip having a first chip main surface, a second chip main surface opposing the first chip main surface, and one or more side surfaces extending between the first chip main surface and second chip main surface;
a reflective side layer surrounding the one or more side surfaces of the LED chip, wherein the reflective side layer has a first reflective side layer main surface and a second reflective side layer main surface opposing the first reflective side layer main surface extending in a first direction, and an opening extending between the first reflective side layer main surface and the second reflective side layer main surface in a second direction substantially perpendicular to said first direction as seen in a cross section view of the device, wherein said opening surrounds the LED chip, and the reflective side layer is directly in contact with the LED chip;
a phosphor film overlying the first main surface of the LED chip and the first main surface of the reflective side layer;
a buffer layer between the phosphor film and the LED chip, wherein the buffer layer is directly in contact with the LED chip and the phosphor film; and
at least one electrode disposed on the second main surface of the LED chip,
wherein the buffer layer extends between the LED chip and the reflective side layer, and
wherein each of the one or more side surfaces of the LED chip includes a first part in contact with the buffer layer and a second part in contact with the reflective side layer.

2. The light emitting device of claim 1, wherein the reflective side layer has one or more outer side surfaces extending between the first main surface and the second main surface of the reflective side layer in the second direction,
wherein the phosphor film has a first main surface and a second main surface opposing the first main surface, and one or more side surfaces extending between the first main surface and the second main surface of the phosphor film,
wherein the first main surface of the phosphor film is in contact with the buffer layer, and
wherein the one or more outer side surfaces of the reflective side layer and the one or more side surfaces of the phosphor film are aligned along said second direction.

3. The light emitting device of claim 1, wherein the phosphor film comprises a first phosphor film layer comprising a first phosphor material and a second phosphor film layer comprising a second phosphor material, wherein the second phosphor material is different from the first phosphor material.

4. The light emitting device of claim 1, wherein a sum of a width of the LED chip and widths of the reflective side layer is substantially the same as a width of the phosphor film in a cross-sectional view.

5. A light emitting device comprising:
an LED chip having a first main surface, a second main surface opposing the first main surface, and one or more side surfaces extending between the first main surface and second main surface;
a reflective side layer surrounding the one or more side surfaces of the LED chip,
wherein the reflective side layer has a first main surface and a second main surface opposing the first main surface, and the reflective side layer is directly in contact with the LED chip;
a phosphor film overlying the first main surface of the LED chip and the first main surface of the reflective side layer;
a buffer layer between the phosphor film and the LED chip, wherein the buffer layer is directly in contact with the LED chip and the phosphor film; and
at least one electrode disposed on the second main surface of the LED chip,
wherein the first main surface of the LED chip and the first main surface of the reflective side layer are substantially coplanar, and
wherein the buffer layer extends between the LED chip and the reflective side layer, and wherein each of the one or more side surfaces of the LED chip includes a first part facing the buffer layer and a second part facing the reflective side layer without facing the buffer layer.

6. The light emitting device of claim 5, wherein the phosphor film comprises a first phosphor film layer comprising a first phosphor material and a second phosphor film layer comprising a second phosphor material, wherein the second phosphor material is different from the first phosphor material.

7. The light emitting device of claim 5, wherein the first part of the each of the one or more side surfaces of the LED chip is in contact with the buffer layer, and the second part of the each of the one or more side surfaces of the LED chip is in contact with the reflective side layer.

8. A light emitting device comprising:
an LED chip having a first main surface, a second main surface opposing the first main surface, and one or more side surfaces extending between the first main surface and second main surface;
a phosphor side layer surrounding the one or more side surfaces of the LED chip, wherein the phosphor side layer has a first main surface and a second main surface opposing the first main surface extending in a first direction, wherein the phosphor side layer is directly in contact with the LED chip, wherein the phosphor side layer converts light emitted from the LED chip into yellow light;
a phosphor film overlying the first main surface of the LED chip and the first main surface of the phosphor side layer, wherein the phosphor film has a first main surface and a second main surface opposing the first main surface extending in the first direction;
a buffer layer between the phosphor film and the LED chip, wherein the buffer layer is directly in contact with the LED chip and the phosphor film; and
at least one electrode disposed on the second main surface of the LED chip,
wherein the phosphor film and the phosphor side layer are different from each other, and
outer side surfaces of the phosphor film are substantially aligned with outer side surfaces of the phosphor side layer along a second direction substantially perpendicular to the first direction,
wherein the buffer layer extends between the LED chip and the phosphor side layer, and
wherein each of the one or more side surfaces of the LED chip includes a first part facing the buffer layer and a second part facing the phosphor side layer without facing the buffer layer.

9. The light emitting device of claim 8, wherein the phosphor film and the phosphor side layer have different densities.

10. The light emitting device of claim 9, wherein the density of the phosphor side layer is less than the density of the phosphor film.

11. The light emitting device of claim 9, wherein the density of the phosphor side layer is about 35-50% of the density of the phosphor film.

12. The light emitting device of claim 8 wherein the phosphor side layer comprises a first phosphor material, and the phosphor film comprises a second phosphor material, wherein the second phosphor material is different from the first phosphor material.

13. The light emitting device of claim 8, wherein the phosphor film comprises a first phosphor film layer comprising a first phosphor material and a second phosphor film layer comprising a second phosphor material, wherein the second phosphor material is different from the first phosphor material.

14. The light emitting device of claim 8, wherein the phosphor side layer includes a yellow phosphor converting the light emitted from the LED chip into the yellow light.

15. The light emitting device of claim 8, wherein the phosphor side layer includes a green-red mixed phosphor converting the light emitted from the LED chip into the yellow light.

16. The light emitting device of claim 8, wherein the phosphor film comprises an upper layer comprising a green phosphor and a lower layer comprising a red phosphor.

17. The light emitting device of claim 8, wherein the first part of the each of the one or more side surfaces of the LED chip is in contact with the buffer layer, and the second part of the each of the one or more side surfaces of the LED chip is in contact with a reflective side layer.

\* \* \* \* \*